United States Patent
Koh et al.

(10) Patent No.: US 9,448,293 B2
(45) Date of Patent: Sep. 20, 2016

(54) SYSTEM FOR COMMUNICATION USABLE BY MAGNETIC RESONANCE AND OTHER IMAGING DEVICES

(71) Applicant: Samsung Electronics Co., Ltd., Gyeonggi-do (KR)

(72) Inventors: Dong Yean Koh, Seoul (KR); Hak Soo Chon, Gyeonggi-do (KR); Myung Sung Song, Gyeonggi-do (KR)

(73) Assignee: Samsung Electronics Co., Ltd, Yeongtong-gu, Suwon-si, Gyeonggi-do (KR)

( * ) Notice: Subject to any disclaimer, the term of this patent is extended or adjusted under 35 U.S.C. 154(b) by 532 days.

(21) Appl. No.: 14/048,452

(22) Filed: Oct. 8, 2013

(65) Prior Publication Data
US 2014/0167760 A1   Jun. 19, 2014

(30) Foreign Application Priority Data

Dec. 17, 2012   (KR) ........................ 10-2012-0147216

(51) Int. Cl.
*G01R 33/36*   (2006.01)

(52) U.S. Cl.
CPC ................................. *G01R 33/3692* (2013.01)

(58) Field of Classification Search
CPC .................................................... G01R 33/3692
See application file for complete search history.

(56) References Cited

U.S. PATENT DOCUMENTS

| 2005/0107681 | A1  | 5/2005 | Griffiths |
| 2010/0106227 | A1* | 4/2010 | Min ..................... A61N 1/3718 607/63 |
| 2011/0109316 | A1* | 5/2011 | Akita ................. G01R 33/3607 324/322 |

FOREIGN PATENT DOCUMENTS

KR   10-2011-0137510 A   12/2011

* cited by examiner

*Primary Examiner* — Rodney Bonnette
(74) *Attorney, Agent, or Firm* — Cha & Reiter, LLC.

(57) ABSTRACT

An imaging apparatus and a method of controlling the same are disclosed. The imaging apparatus control method includes generating a pulse signal to an imaging unit, the imaging unit imaging an object to acquire an image signal of the object, generating an antiphase pulse signal based on the generated pulse signal, the antiphase pulse signal having an opposite phase to that of the pulse signal, and controlling a wireless communication unit based on the antiphase pulse signal, the wireless communication unit transmitting the image signal using a wireless communication network.

22 Claims, 20 Drawing Sheets

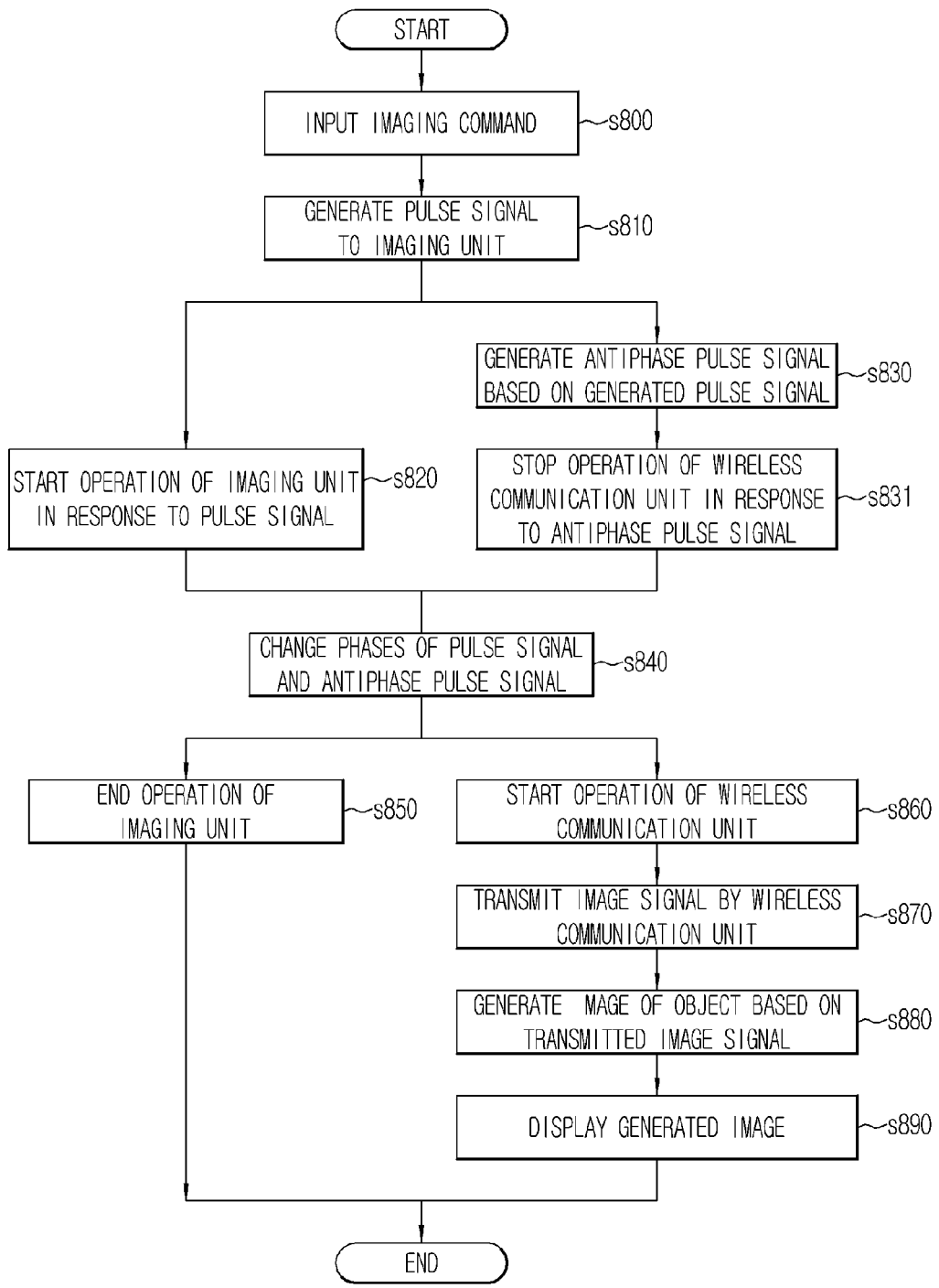

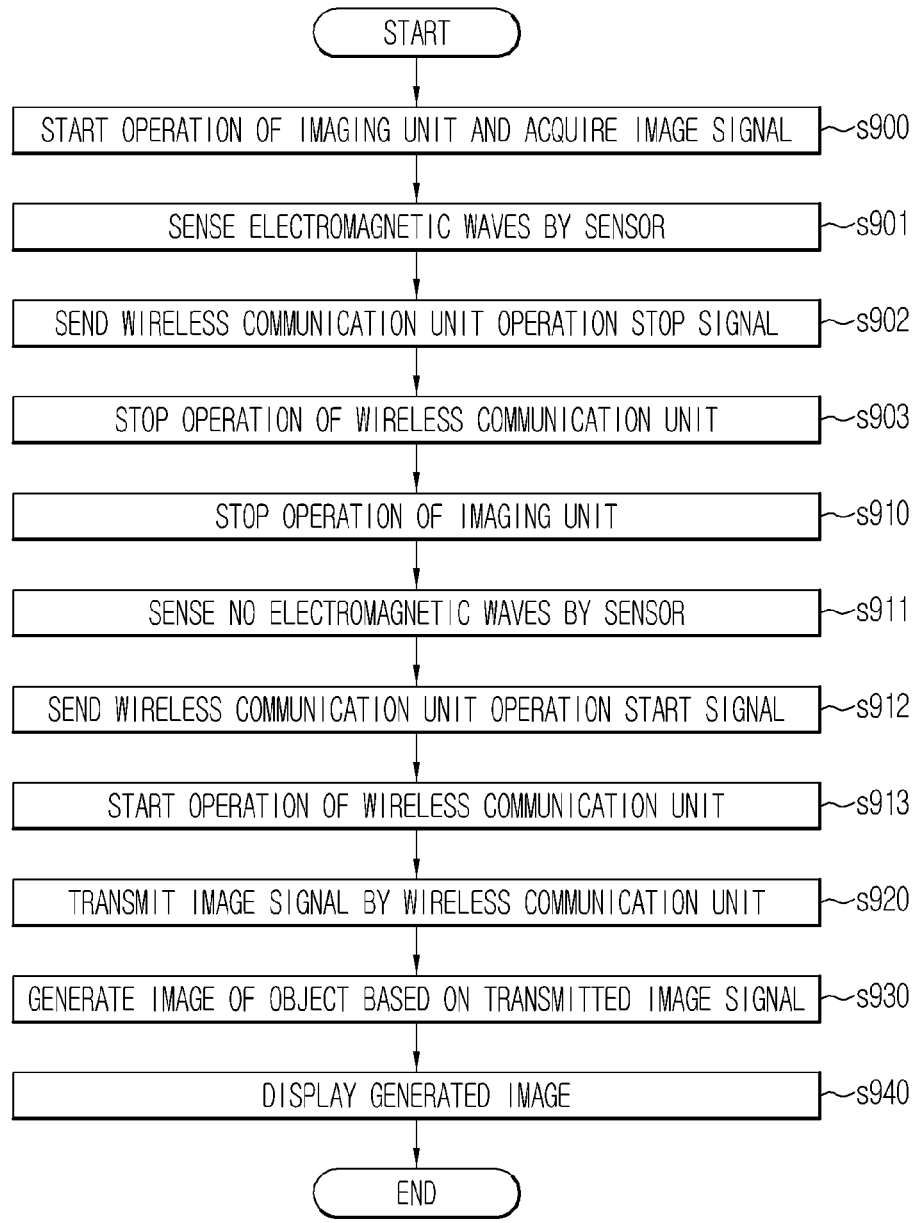

SYSTEM FOR COMMUNICATION USABLE BY MAGNETIC RESONANCE AND OTHER IMAGING DEVICES

CROSS-REFERENCE TO RELATED APPLICATION

This application claims the benefit of Korean Patent Application No. 10-2012-0147216, filed on Dec. 17, 2012 in the Korean Intellectual Property Office, the disclosure of which is incorporated herein by reference.

TECHNICAL FIELD

The present disclosure relates to an imaging system and a method of control and communication usable by the imaging system.

BACKGROUND

An imaging apparatus images an object (subject) to acquire an image signal, performs image processing for the acquired image signal to generate a visual image, and displays the generated visual image to the user. The imaging apparatus acquires the visual image of the object using various methods. For example, in the case where the imaging apparatus is a camera, it senses light, for example, visible light or infrared light, reflected from the object and converts the sensed light into a visual image.

The imaging apparatus may also image the inside of the object. For example, such an imaging apparatus may be an ultrasonic imaging apparatus, a radiography imaging apparatus, a magnetic resonance imaging (MRI) apparatus, or the like. An ultrasonic imaging apparatus emits ultrasonic waves to the inside of an object using a transducer, receives an echo signal reflected from the inside of the object and obtains an ultrasonic image of the inside of the object based on the received echo signal. A radiography imaging apparatus, for example, a digital radiography (DR) imaging apparatus or computed tomography (CT) imaging apparatus irradiates an object and obtains a radiation image of the inside of the object using radiation absorption differences among substances inside the object based on physical characteristics such as mass.

In an MRI apparatus, a nucleus of an atom, for example, hydrogen (H), inside an object has a precession when a magnetic field is applied to the object in a certain direction. Then, upon receiving electromagnetic waves of a Larmor frequency, the atomic nucleus resonates to induce a voltage signal in an adjacent radio frequency (RF) coil. The MRI apparatus generates an image of the inside of the object based on the voltage signal induced in this manner.

MRI devices are widely used in bioengineering research and medical examination and obtain a detailed image of the inside of an object and do not involve radiation exposure unlike radiography imaging devices. A system according to invention principles addresses deficiencies in imaging system wireless communication and control, for example, and related problems.

SUMMARY

A system according to invention principles provides an imaging device wireless communication and control system usable by a magnetic resonance imaging apparatus in imaging an object using a magnetic field and electromagnetic waves. In response to an object being imaged using electromagnetic waves, the system removes noise in an acquired image resulting from interference between the electromagnetic waves and radio waves used in wireless communication. The system further performs wired transmission of a variety of acquired image signals to address spatial restrictions resulting from device and electronic circuit cable transmission limitations.

Additional aspects of the invention are set forth in part in the description which follows and, in part, will be obvious from the description, or may be learned by practice of the invention.

An imaging system includes an imaging unit to acquire an image signal of an object using electromagnetic waves, a wireless communication unit to transmit the acquired image signal using a wireless communication network, and a control unit to stop an operation of the wireless communication unit when the imaging unit operates. In an embodiment, the control unit operates the wireless communication unit in stopping operation of the imaging unit. The imaging system generates the electromagnetic waves or stops the generation of the electromagnetic waves in response to a pulse signal applied thereto. Further, in an embodiment, the control unit generates an antiphase pulse signal, derived by calculation, having an opposite phase to that of the pulse signal, for example, and controls the wireless communication unit based on the antiphase pulse signal.

The control unit applies or interrupts power to the wireless communication unit based on the antiphase pulse signal to control the operation of the wireless communication unit. The wireless communication unit transmits the image signal to an external wireless reception unit using an asynchronous wireless communication system employing a signal duration of at least 500 msec.

In another embodiment, an imaging system includes an imaging unit to acquire an image signal of an object using electromagnetic waves, and a wireless communication unit to transmit the acquired image signal to an external wireless reception unit. The wireless communication unit ceases operation in response to imaging system operation, and operates (and starts operation) when the imaging system does not operate.

A method of controlling an imaging system includes generating a pulse signal for communication to an imaging system. The imaging system images an object to acquire an image signal of the object, generates an antiphase pulse signal based on the generated pulse signal where the antiphase pulse signal has an opposite phase to that of the pulse signal, and controls a wireless communication unit based on the antiphase pulse signal. The wireless communication unit transmits the image signal using a wireless communication network. The control may include stopping an operation of the wireless communication unit when the imaging system generates electromagnetic waves, and operating the wireless communication unit when the imaging system stops the generation of the electromagnetic waves. The method further includes the imaging system imaging the object in response to the pulse signal to acquire the image signal of the object and the wireless communication unit transmits the acquired image signal to an external wireless reception unit when operating. The control includes applying or interrupting power to the wireless communication unit based on the antiphase pulse signal to control an operation of the wireless communication unit. The wireless communication unit may transmit the image signal using an asynchronous wireless communication system.

In addition, a magnetic resonance imaging apparatus includes an imaging system to generate electromagnetic waves, apply the generated electromagnetic waves to an object exposed to a magnetic field, and receive a magnetic resonance signal generated in the object by the applied electromagnetic waves, a wireless communication unit to transmit the received magnetic resonance signal, a wireless reception unit to receive the magnetic resonance signal from the wireless communication unit, an image processing unit to generate a magnetic resonance image based on the magnetic resonance signal received by the wireless reception unit, and a control unit to stop an operation of the wireless communication unit while the imaging system generates the electromagnetic waves and applies the generated electromagnetic waves to the object. The control unit in an embodiment operates the wireless communication unit when the imaging system stops the generation of the electromagnetic waves and the application of the electromagnetic waves to the object.

The control unit may include a pulse signal generator to generate a pulse signal for control of an operation of the imaging system and apply the generated pulse signal to the imaging system. The imaging system generates the electromagnetic waves or stops the generation of the electromagnetic waves in response to the pulse signal.

BRIEF DESCRIPTION OF THE DRAWINGS

These and/or other aspects of the invention will become apparent and more readily appreciated from the following description of the embodiments, taken in conjunction with the accompanying drawings of which:

FIGS. 11, 12, 13 and 14 are flowcharts illustrating various embodiments of a method of controlling the imaging apparatus according to invention principles.

DETAILED DESCRIPTION

Figure 1A:
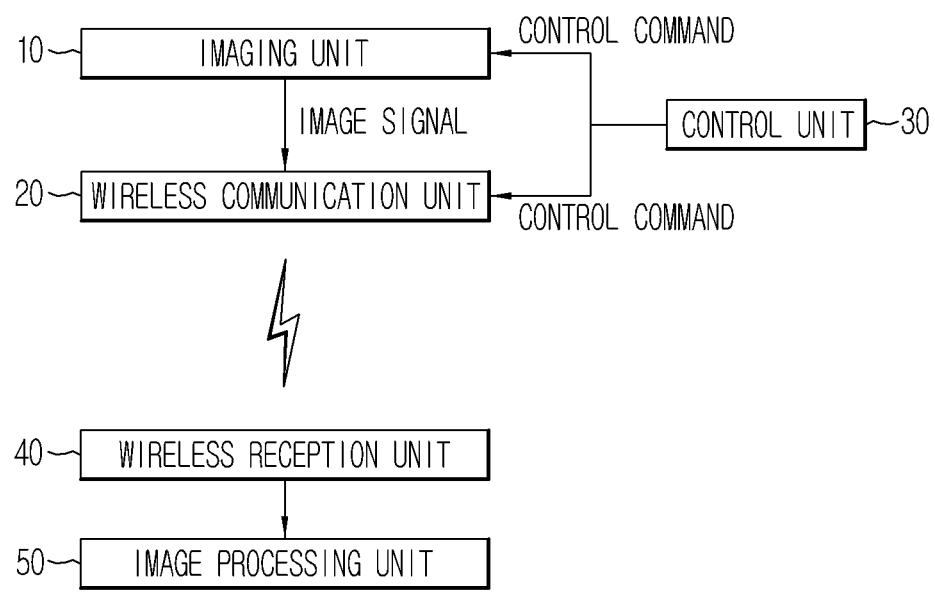
FIGS. 1A and 1B are block diagrams illustrating an embodiment of an imaging apparatus according to invention principles.

Reference will now be made in detail to the embodiments of the present invention, examples of which are illustrated in the accompanying drawings, wherein like reference numerals refer to like elements throughout.

Figure 1B:
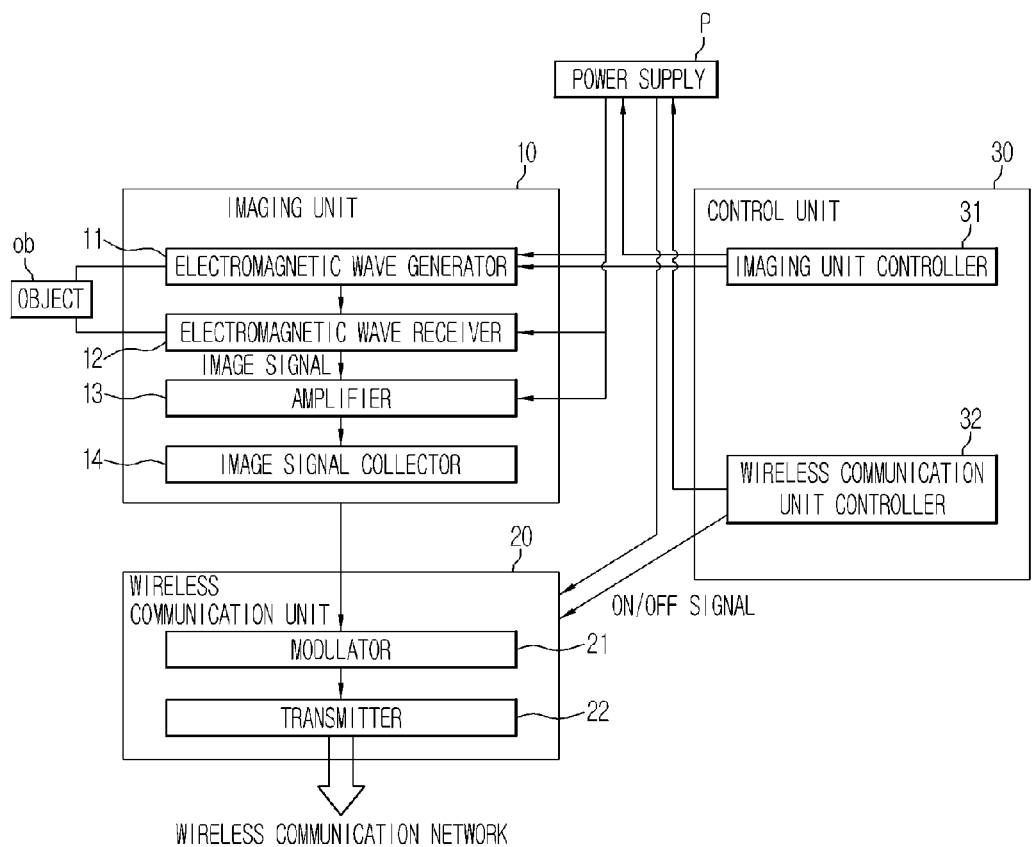

FIGS. 1A and 1B are block diagrams illustrating an embodiment of an imaging apparatus.

Referring to FIGS. 1A and 1B, the imaging apparatus includes an imaging unit 10 to image an object ob, for example, a human body to acquire an image signal of the object ob, a wireless communication unit 20 to transmit the image signal acquired by the imaging unit 10 externally using a wireless communication network, and a control unit 30 to control the imaging unit 10 and the wireless communication unit 20. The imaging apparatus further includes a wireless reception unit 40 to receive the image signal transmitted from the wireless communication unit 20, and an image processing unit 50 to generate an image based on the image signal received by the wireless reception unit 40.

Although the following description of the imaging apparatus concerns embodiments in which the imaging unit 10 and the wireless communication unit 20 are controlled by the control unit 30, the imaging unit 10 may directly transmit a certain electrical signal, for example, an operation signal or operation stop signal to the wireless communication unit 20 to control the wireless communication unit 20. Also, the converse may be possible. The imaging unit 10 applies electromagnetic waves of a certain frequency to the object, receives a signal in response to the applied electromagnetic waves, for example, a magnetic resonance signal generated based on magnetization of an atomic nucleus of the internal tissue of the object, and stores the received signal as it is or amplifies and stores the received signal for processing to provide an image signal. In this case, the electromagnetic waves applied to the object may be radio frequency (RF) electromagnetic waves and, in some cases, may be electromagnetic waves of an ultra-high frequency (UHF) band of several tens to several hundreds MHz.

The imaging unit 10 includes an electromagnetic wave generator 11 and an electromagnetic wave receiver 12. In some embodiments, the imaging unit 10 may further include an amplifier 13 and an image signal collector 14. The electromagnetic wave generator 11 generates electromagnetic waves of a certain band such as RF electromagnetic waves and applies the generated electromagnetic waves to the object ob. For example, in the case where the imaging apparatus is a magnetic resonance imaging apparatus, the electromagnetic wave generator 11 may be an RF coil set to a transmission mode to apply RF electromagnetic waves to the inside of the object ob.

The electromagnetic wave receiver 12 receives a signal generated from the object ob due to the application of the electromagnetic waves, for example, a magnetic resonance signal. In a magnetic resonance imaging apparatus, the electromagnetic wave receiver 12 may be a reception-mode RF coil which receives a magnetic resonance image signal. Although the electromagnetic wave generator 11 and the electromagnetic wave receiver 12 are separately shown in FIG. 1B, they may be integrated into one unit in some embodiments. One type of unit such as a transmission and reception coil may perform both the function of generating and applying the electromagnetic waves and the function of receiving the signal generated from the object. The amplifier 13 amplifies an image signal, for example, a magnetic resonance signal, received by the electromagnetic wave receiver 12. When the received image signal is weak, it is vulnerable to noise or to being lost during transmission and reception or during image processing. For this reason, the received image signal is amplified through the amplifier 13, a low-noise preamplifier, for example, as needed.

The image signal collector 14 collects and stores the image signal received by the electromagnetic wave receiver 12 or received by the electromagnetic wave receiver 14 and amplified by the amplifier 13, and transfers the collected image signal to the wireless communication unit 20. In some embodiments, the received or amplified image signal may be transferred to the wireless communication unit 20 directly, not via the image signal collector 14.

The wireless communication unit 20 transmits the acquired image signal to an external device, for example, the wireless reception unit 40 using radio waves. The wireless communication unit 20 may transmit the image signal using a short-range wireless communication technology such as Bluetooth or Wi-Fi. Alternatively, the wireless communication unit 20 may transmit the acquired image signal to the external wireless reception unit 40 using an asynchronous wireless communication system, for example, a wideband code division multiple access (WCDMA) system. In this case, the asynchronous wireless communication system may have a communication signal duration of at least 500 msec.

In order to transmit the image signal to the external wireless reception unit 40 in the above manner, the wireless communication unit 20 may use radio waves of a radio frequency of several tens to several hundreds MHz. The wireless communication unit 20 includes a modulator 21 to modulate the transferred image signal, and a transmitter 22 to transmit the signal modulated by the modulator 21 to the external wireless reception unit 40 over the wireless communication network. As stated above, the transferred image signal may be that transferred directly by the electromagnetic wave receiver 12, that amplified by the amplifier 13, or that stored in the image signal collector 14. The transmitter 22 may include an antenna module, for example, for wireless communication.

The control unit 30 controls the operations of the imaging unit 10 and wireless communication unit 20. In particular, the control unit 30 determines the operation of the wireless communication unit 20 based on the operation of the imaging unit 10, generates a control signal as a result of the determination, and sends the generated control signal to the imaging unit 10 or wireless communication unit 20.

Figure 2A:
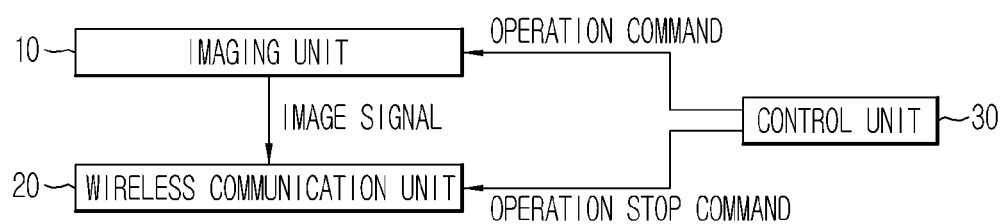
FIGS. 2A and 2B are block diagrams illustrating embodiments for control of an imaging unit and a wireless communication unit according to invention principles.
Figure 2B:
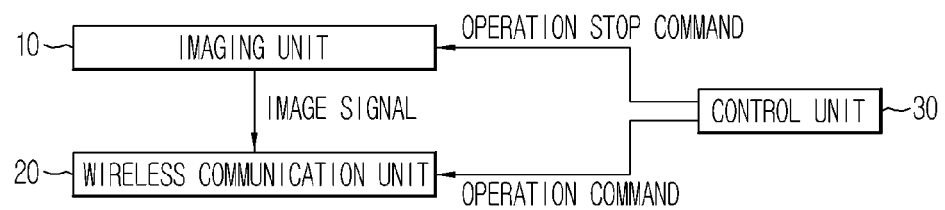

FIGS. 2A and 2B are block diagrams illustrating embodiments for control of the imaging unit and wireless communication unit. As shown in FIG. 2A, the control unit 30 sends, to the imaging unit 10, an operation command to instruct the imaging unit 10 to image the object to acquire an image signal, and, conversely, sends, to the wireless communication unit 20, an operation stop command to instruct the wireless communication unit 20 not to perform wireless communication. In addition, for example, when the image signal acquisition of the imaging unit 10 is ended, the control unit 30 sends, to the imaging unit 10, an operation stop command to instruct the imaging unit 10 to stop the operation thereof, and sends, to the wireless communication unit 20, an operation command to instruct the wireless communication unit 20 to transmit the image signal transferred from the imaging unit 10. These commands to control the imaging unit 10 and the wireless communication unit 20 are generated according to determinations of the control unit 30 or predetermined settings. In order to control the imaging unit 10 and the wireless communication unit 20 such that they operate in different modes, the control unit 30 includes an imaging unit controller 31 to control the imaging unit 10, and a wireless communication unit controller 32 to control the wireless communication unit 20, as shown in FIG. 1B.

The imaging unit controller 31 of the control unit 30 generates a control signal such that the imaging unit 10 generates electromagnetic waves to acquire an image signal of the object ob, and sends the generated control signal to the imaging unit 10. When the imaging unit 10 operates in response to the control signal and generates the electromagnetic waves to image the object, the wireless communication unit controller 32, concurrently with or subsequently to the control signal generation and sending performed by the imaging unit controller 31, generates an operation stop command to stop the operation of the wireless communication unit 20, and send the generated operation stop command to the wireless communication unit 20. Therefore, the control unit 30 performs a control operation such that the wireless communication unit 20 is in its stop state or idle state when the imaging unit 10 is in its active state.

Conversely, the imaging unit controller 31 of the control unit 30 generates a control signal such that the imaging unit 10 does not operate, and sends the generated control signal to the imaging unit 10. When the imaging unit 10 does not operate and unit 10 stops the electromagnetic wave generation and thus does not perform imaging, the wireless communication unit controller 32 generates an operation command to the wireless communication unit 20 concurrently with or subsequently to the control signal generation and sending performed by the imaging unit controller 31. The generated operation command is sent to the wireless communication unit 20, which is controlled to operate in response to the sent operation command, to perform wireless communication. Therefore, the control unit 30 performs a control operation such that the wireless communication unit 20 is in its active state when the imaging unit 10 is in its stop state or idle state.

The imaging unit controller 31 or wireless communication unit controller 32 sends a control signal to a power supply p (FIG. 1B) electrically connected with the imaging unit 10 or wireless communication unit 20, to interrupt supply of power to the imaging unit 10 or wireless communication unit 20 so as to control the operation of the imaging unit 10 or wireless communication unit 20. Because both the radio waves generated by the wireless communication unit 20 and the electromagnetic waves applied to the object have radio frequencies as stated above, they may overlap in bandwidth. When the electromagnetic waves from the imaging unit 10 and the radio waves from the wireless communication unit 20 overlap in bandwidth in this manner, they may interact generating noise, resulting in degradation in quality of an image acquired by imaging unit 10.

Imaging unit 10 may be affected by the radio waves output from the wireless communication unit 20 so that noise is generated in an image signal acquired by the imaging unit 10, or the wireless communication unit 20 may be affected by the electromagnetic waves output from the imaging unit 10 so that the wireless reception unit 40 receives an image signal contaminated by noise. As a result, the image processing unit 50 generates an image in response to the noise-contaminated image signal, leading to degradation in accuracy and quality of the image. The control unit 30 performs a control operation to enable operation of one of the imaging unit 10 and the wireless communication unit 20 excluding operation of the remaining unit, thereby blocking or minimizing noise which may result from interference between the electromagnetic waves from the imaging unit 10 and the radio waves from the wireless communication unit 20.

Figure 3:
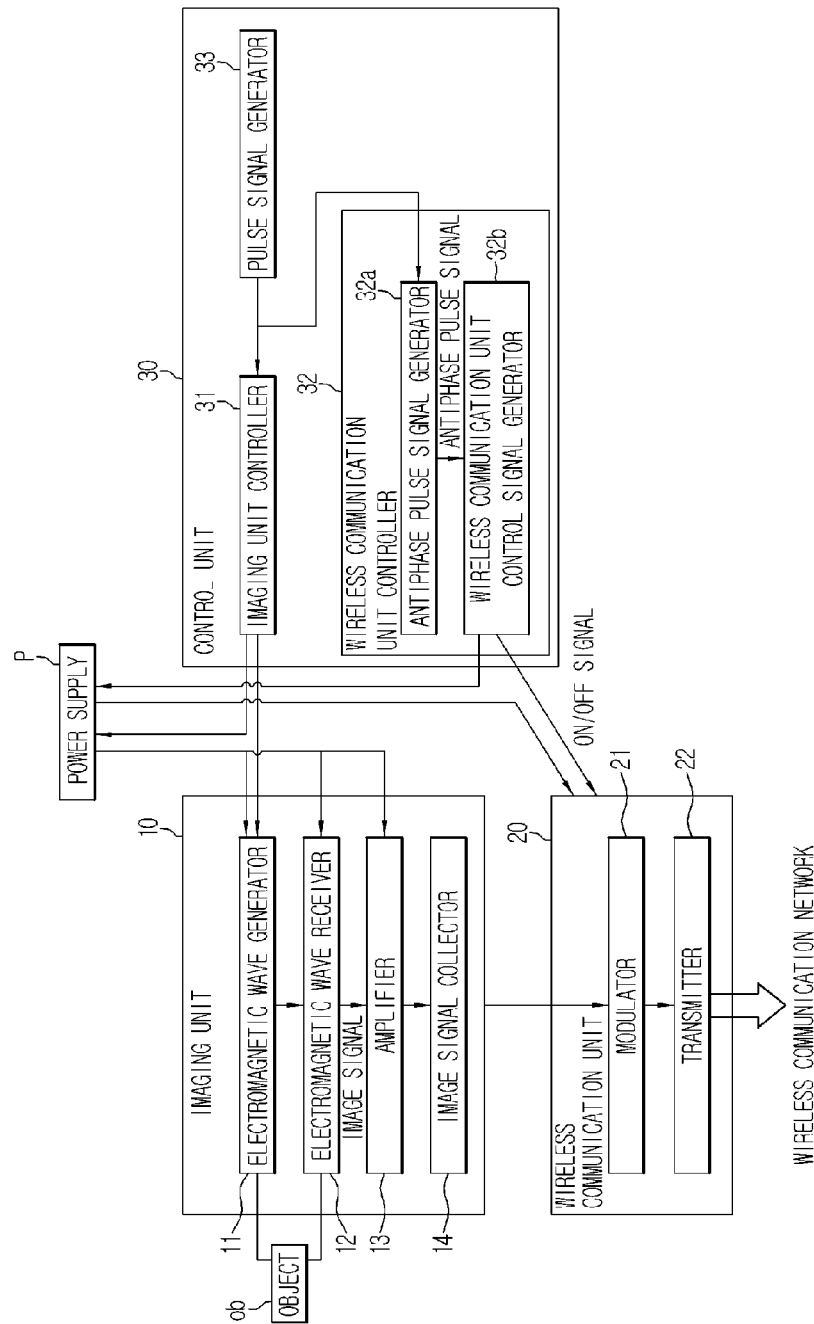
FIG. 3 is a block diagram illustrating another embodiment of the imaging apparatus according to invention principles.

FIG. 3 is a block diagram illustrating another embodiment of the imaging apparatus in which the control unit 30 of the imaging apparatus further includes a pulse signal generator 33. The wireless communication unit controller 32 includes an antiphase pulse signal generator 32*a* and a wireless communication unit control signal generator 32*b*. The pulse signal generator 33 generates a pulse signal for control of the imaging unit 10, for example, and conveys the generated pulse signal to the imaging unit controller 31 and the wireless communication unit controller 32. The imaging unit controller 31 generates a control signal conveyed to the imaging unit 10 in response to the pulse signal and sends the generated control signal to the imaging unit 10. The imaging unit 10 generates electromagnetic waves or stops electromagnetic wave generation in response to the sent control signal. That is, the imaging unit 10 enters its active state or enters its stop state or idle state in response to the pulse signal.

The wireless communication unit controller 32 receives the pulse signal, and the antiphase pulse signal generator 32*a* of the wireless communication unit controller 32 generates a pulse signal of an opposite phase to that of the received pulse signal, namely, an antiphase pulse signal based on the received pulse signal and transfers the generated antiphase pulse signal to the wireless communication unit control signal generator 32*b*. The wireless communication unit control signal generator 32*b* generates a control signal for control of the wireless communication unit 20 based on the antiphase pulse signal and sends the generated control signal to the wireless communication unit 20. The wireless communication unit 20 performs or does not perform wireless communication in response to the sent control signal. In other words, the wireless communication unit 20 enters its active state or enters its stop state or idle state in response to the antiphase pulse signal.

Figure 4A:
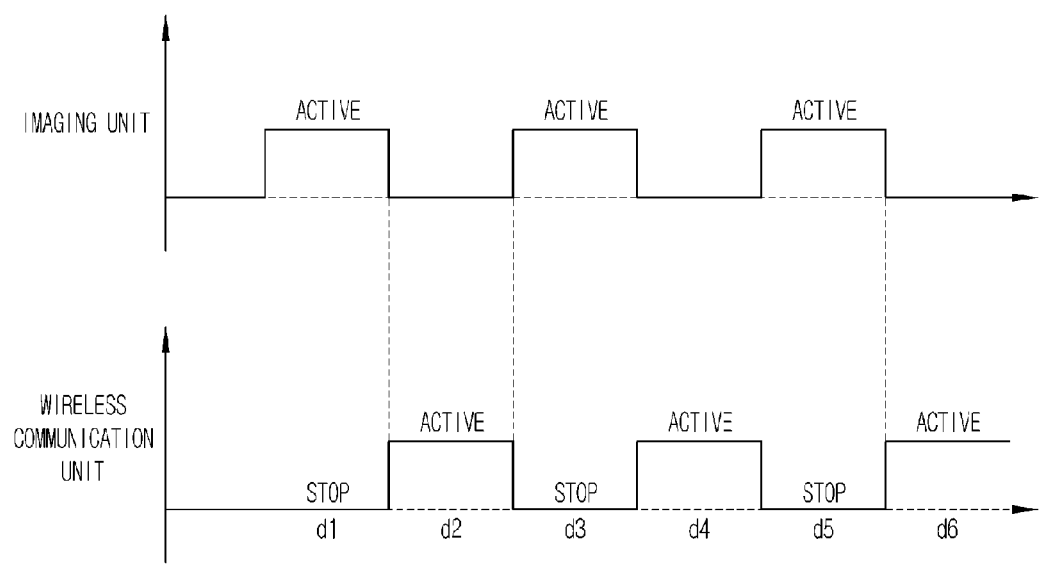
FIGS. 4A, 4B and 4C are timing diagrams illustrating various embodiments of pulse sequences to the imaging unit and the wireless communication unit according to invention principles.
Figure 4B:
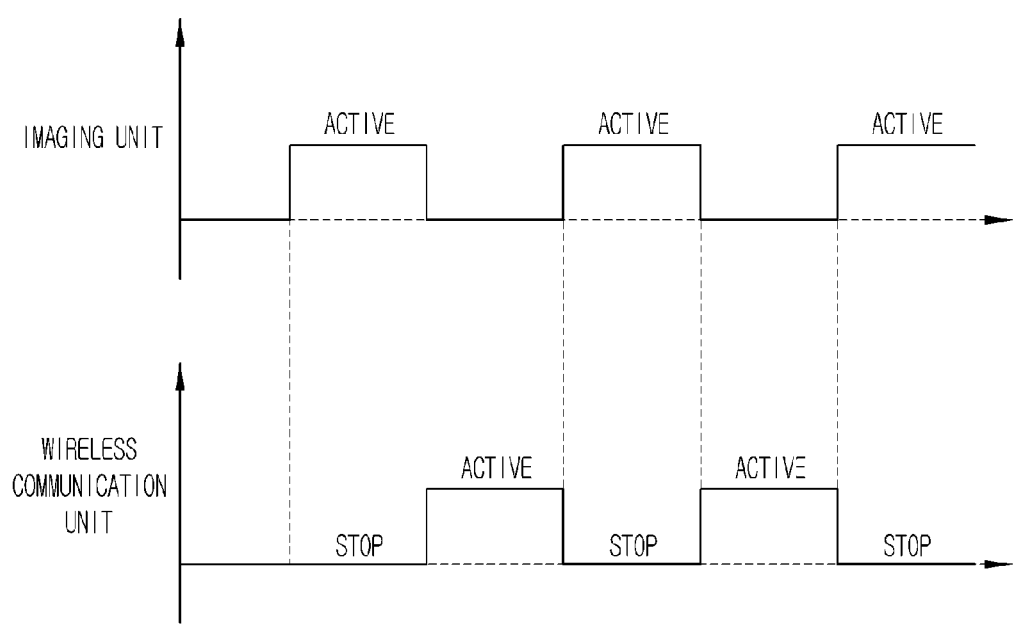
Figure 4C:
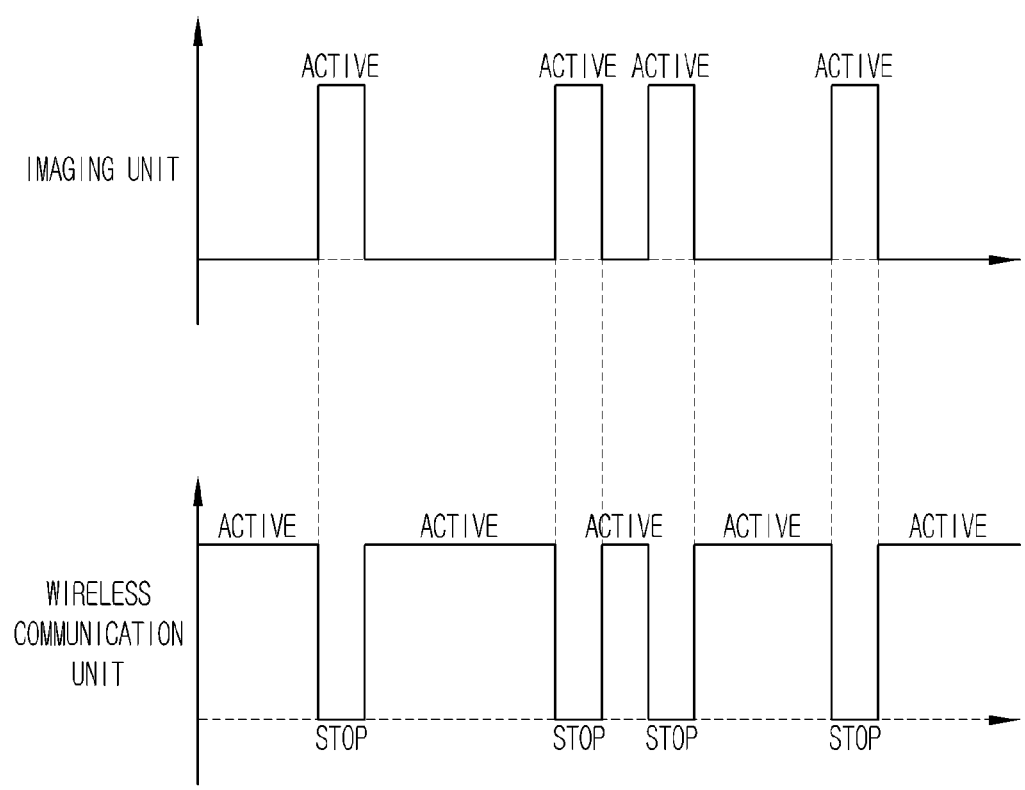

FIGS. 4A to 4C are timing diagrams illustrating various embodiments of pulse sequences to the imaging unit and the wireless communication unit. The pulse signal generator 33 generates and outputs pulse signals of pulse sequences as shown in the upper graphs of FIGS. 4A to 4C, specifically, the pulse signal generator 33 outputs a pulse signal of a pulse sequence as shown in the upper graph of FIG. 4A. The imaging unit controller 31 generates a control signal to the imaging unit 10 based on the pulse sequence of the upper graph of FIG. 4A. In this case, when the pulse signal is not 0 (d1, d3 or d5), the imaging unit controller 31 generates an operation command to the imaging unit 10 and sends the generated operation command to the imaging unit 10. Conversely, when the pulse signal is 0 (d2, d4 or d6), the imaging unit controller 31 generates an operation stop command to the imaging unit 10 and sends the generated operation stop command to the imaging unit 10.

In response to receiving the operation command from the imaging unit controller 31, the imaging unit 10 starts the operation thereof to acquire an image signal of the object ob. However, upon receiving the operation stop command from the imaging unit controller 31, the imaging unit 10 stops the operation thereof and enters its idle state or stop state so as to inhibit further imaging. As a result, as shown in the upper graph of FIG. 4A, the imaging unit 10 transitions to its active state when the pulse signal is not 0 (d1, d3 or d5), and to its idle state when the pulse signal is 0 (d2, d4 or d6).

The antiphase pulse signal generator 32*a* generates an antiphase pulse signal as shown in the lower graph of FIG. 4A when the pulse signal of the pulse sequence as shown in the upper graph of FIG. 4A is input. For example, the antiphase pulse signal generator 32*a* may output a pulse signal which is not 0, when the pulse signal input is 0 (d2, d4 or d6), and a pulse signal which is 0, when the input pulse signal is not 0 (d1, d3 or d5). As a result, the antiphase pulse signal generator 32*a* may generate the antiphase pulse signal as shown in the lower graph of FIG. 4A.

According to another embodiment, although not shown, the antiphase pulse signal generator 32*a* may output a pulse signal having a value different from that of a pulse signal input thereto, for example, a pulse signal having the same absolute value as that of the input pulse signal, but a sign different from that of the input pulse signal, for example, a pulse signal having a negative value when the input pulse signal has a positive value. In an embodiment, the antiphase pulse signal generator 32*a* may generate an antiphase pulse signal in real time based on a pulse signal which is input thereto as stated above. In another embodiment, the antiphase pulse signal generator 32*a* may separately receive information about a pulse sequence from the pulse signal generator 33, calculate an antiphase pulse sequence based on the received pulse sequence information, and generate an antiphase pulse signal having the calculated antiphase pulse sequence.

The wireless communication unit control signal generator 32*b* generates a control signal conveyed to the wireless communication unit 20 based on the antiphase pulse sequence shown in the lower graph of FIG. 4A.

In this case, when the antiphase pulse signal is not 0 (d2, d4 or d6), the wireless communication unit control signal generator 32*b* generates an operation command to the wireless communication unit 20. Conversely, when the antiphase pulse signal is 0 (d1, d3 or d5), the wireless communication unit control signal generator 32*b* generates an operation stop command to the wireless communication unit 20. The operation command or operation stop command generated by the wireless communication unit control signal generator 32*b* is sent to the wireless communication unit 20.

Upon receiving the operation command, the wireless communication unit 20 starts the operation thereof to initiate transmission of an image signal to the external wireless reception unit 40 and the wireless communication unit 20 enters its active state. Conversely, upon receiving the operation stop command, the wireless communication unit 20 stops the wireless communication and enters an idle state or stop state. If the wireless communication unit 20 has been in its idle state or stop state before the operation stop command is received, it remains in its idle state or stop state.

As shown in the lower graph of FIG. 4A, the wireless communication unit 20 enters its active state when the antiphase pulse signal is not 0 (d2, d4 or d6), and its idle state or stop state when the antiphase pulse signal is 0 (d1, d3 or d5). As a result, the wireless communication unit 20 operates in an opposite manner to the imaging unit 10. That is, the wireless communication unit 20 may not operate when the imaging unit 10 operates, and operates when the imaging unit 10 does not operate. In other words, exclusively one of the imaging unit 10 and wireless communication unit 20 of the imaging apparatus operate.

According to another embodiment, the pulse signal and the antiphase pulse signal may have pulse sequences as shown in FIG. 4B, respectively. The pulse signal in FIG. 4B is output as the same pulse sequence as that in FIG. 4A. The antiphase pulse signal generated by the antiphase pulse signal generator 32*a* as shown in FIG. 4B may have a zero duration longer than that in FIG. 4A and a non-zero duration shorter than that in FIG. 4A so that there may be a certain time difference between the operation of the imaging unit 10 and the operation of the wireless communication unit 20. That is, the wireless communication unit 20 may start operation and wireless communication starts at a certain time after the imaging unit 10 ends operation Also unit 20 and the wireless communication end operation at a certain time before the imaging unit 10 starts operation.

According to a further embodiment, the pulse signal and the antiphase pulse signal may have pulse sequences as shown in FIG. 4C, respectively. That is, there may be no fixed pattern in the pulse sequences. As needed, the driving time of the imaging unit 10 may be set to be shorter and the idle time of the imaging unit 10 in which the imaging unit 10 is not driven, may be set to be longer. In addition, the idle time of the imaging unit 10 may be set to be shorter so that the imaging unit 10 is able to successively acquire portions of an image signal of the object ob.

Figure 5A:
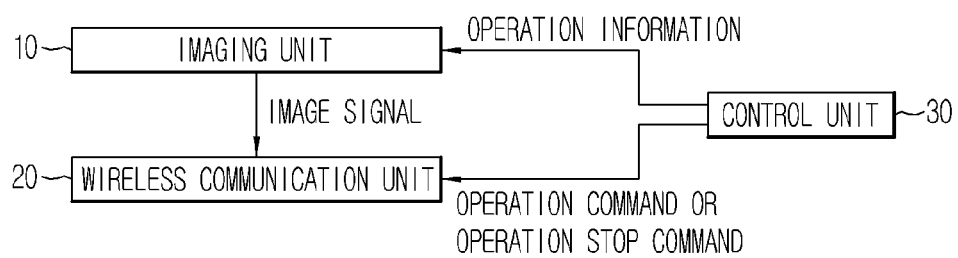
FIG. 5A is a block diagram illustrating another embodiment for the control of the imaging unit and wireless communication unit according to invention principles.

FIG. 5A is a block diagram illustrating another embodiment for the control of the imaging unit and wireless communication unit where the control unit 30 generates a control signal conveyed to the imaging unit 10 or wireless communication unit 20 in response to the state of the imaging unit 10 or wireless communication unit 20 and sends the generated control signal to the imaging unit 10 or wireless communication unit 20. As shown in FIG. 5A, instead of generating a control signal conveyed to the imaging unit 10, the control unit 30 may receive, from the imaging unit 10, information about whether the imaging unit 10 operates, for example, performs imaging, comprising operation information, and sends a certain command to the wireless communication unit 20 based on the received operation information. In this case, the control unit 30 sends an operation stop command to the wireless communication unit 20 when the imaging unit 10 operates and an operation command to the wireless communication unit 20 when the imaging unit 10 does not operate.

In this case, the control unit 30 receives an electromagnetic wave sense signal generated by a sensor, for example, an electromagnetic wave sensor, installed in the imaging unit 10 and controls the wireless communication unit 20 based on the received electromagnetic wave sense signal. Alternatively, the control unit 30 receives information about whether power is applied to the imaging unit 10, and controls the wireless communication unit 20 based on the received information.

Figure 5B:
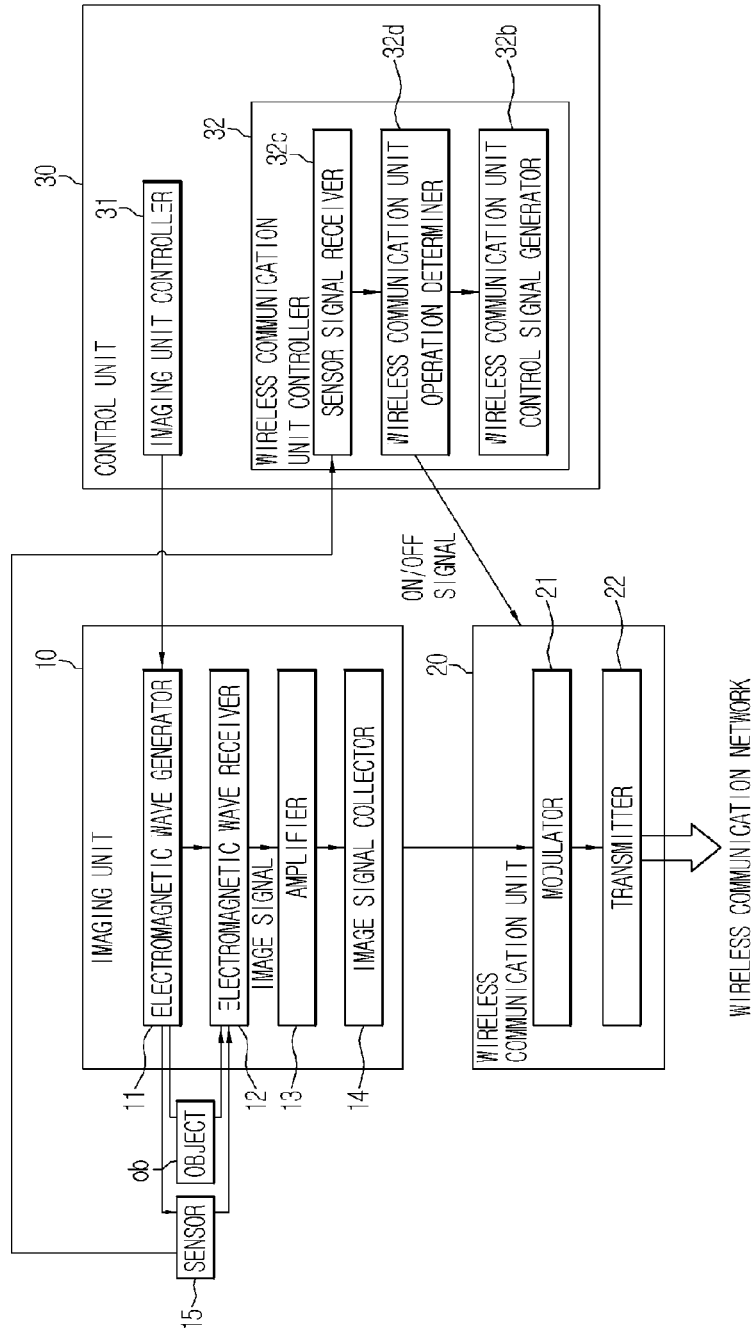
FIG. 5B is a block diagram illustrating a further embodiment of the imaging apparatus according to invention principles.

FIG. 5B is a block diagram illustrating a further embodiment of the imaging apparatus where the imaging apparatus further includes a sensor 15, as shown in FIG. 5B. The sensor 15 senses electromagnetic waves generated from the electromagnetic wave generator 11, generates an electrical signal based on the electromagnetic wave sensing, and sends the generated electrical signal to the control unit 30. Alternatively, although not shown, the sensor 15 may generate a certain electrical signal, for example, a wireless communication unit operation stop signal based on the electromagnetic wave sensing and send the generated signal directly to the wireless communication unit 20.

In this case, the wireless communication unit controller 32 of the control unit 30 may include a sensor signal receiver 32c, a wireless communication unit operation determiner 32d, and a wireless communication unit control signal generator 32b. The sensor signal receiver 32c receives the signal sent from the sensor 15. The wireless communication unit operation determiner 32d determines, based on the signal received by the sensor signal receiver 32c, whether electromagnetic waves are generated by unit 11 of the imaging unit 10 and transfers a result of the determination to the wireless communication unit control signal generator 32b. The wireless communication unit control signal generator 32b generates a control signal conveyed to the wireless communication unit 20 based on the transferred determination result.

In the case where electromagnetic waves are sensed by the sensor 15, and imaging using electromagnetic waves is in progress, the wireless communication unit control signal generator 32b generates an operation stop command for the wireless communication unit 20 and sends the generated command to the wireless communication unit 20. The wireless communication unit 20 stops operation or remains idle, in response to the operation stop command. Conversely, in the case where electromagnetic waves are not sensed by the sensor 15, in the case where imaging using electromagnetic waves is not in progress, the wireless communication unit control signal generator 32b generates an operation command to the wireless communication unit 20 signifying to continue operation and sends the generated command to the wireless communication unit 20. As a result, when the imaging unit 10 operates and electromagnetic waves are generated, the wireless communication unit 20 is controlled not to operate. Conversely, when the imaging unit 10 does not operate and electromagnetic waves are not generated, the wireless communication unit 20 is controlled to operate. Therefore, the electromagnetic waves from the imaging unit 10 and the radio waves from the wireless communication unit 20 are controlled and interference is advantageously prevented.

Figure 5C:
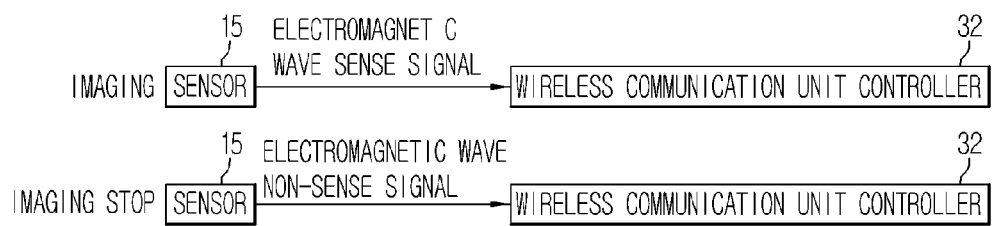
FIG. 5C is a block diagram illustrating an embodiment of the operations of a sensor and a wireless communication unit controller according to invention principles.

FIG. 5C is a block diagram illustrating an embodiment of the operations of the sensor and wireless communication unit controller where the sensor 15 sends an electromagnetic wave sense signal to the wireless communication unit controller 32 when electromagnetic waves are sensed and imaging is performed by the imaging unit 10, and an electromagnetic wave non-detect sense signal to the wireless communication unit controller 32 when electromagnetic waves are not sensed and imaging is not performed by the imaging unit 10. Alternatively, when electromagnetic waves are not sensed, the sensor 15 does not send a signal to the wireless communication unit controller 32. In this case, the wireless communication unit controller 32 generates a control signal to stop the operation of the wireless communication unit 20. Alternatively, in response to non-reception or absence of a certain signal, for example, the electromagnetic wave sense signal, a control signal is generated to start or maintain the operation of the wireless communication unit 20.

Figure 6:
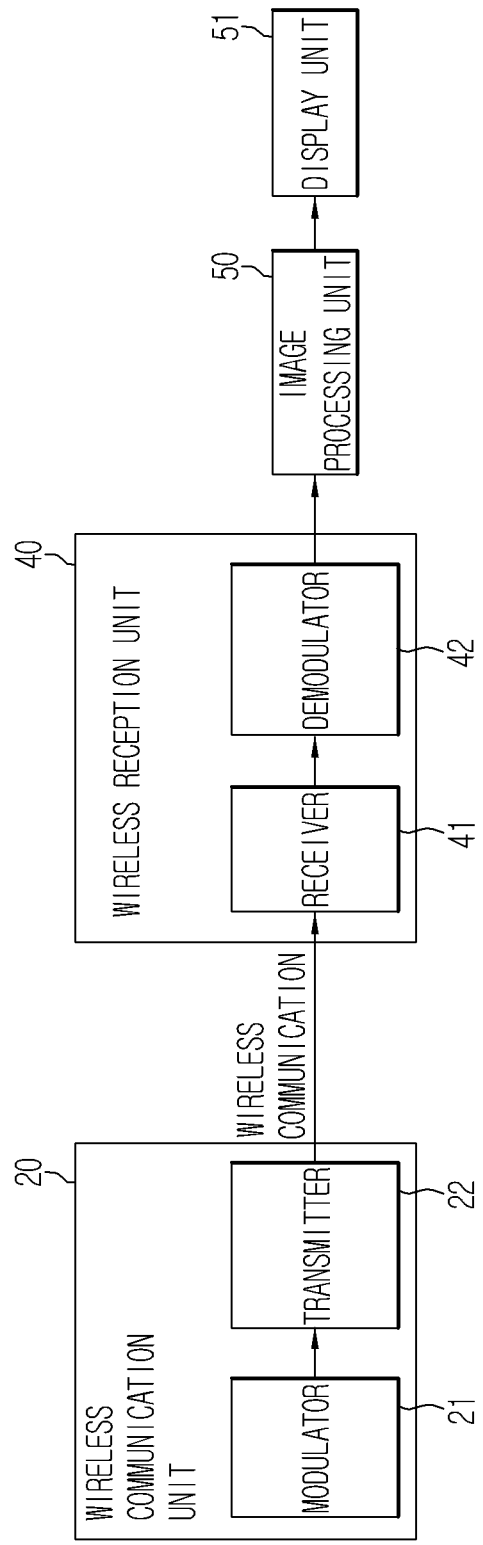
FIG. 6 is a block diagram illustrating an embodiment of the wireless communication unit and a wireless reception unit according to invention principles.

FIG. 6 is a block diagram illustrating an embodiment of the wireless communication unit 20 and wireless reception unit where unit 20 transmits an image signal acquired by the imaging unit 10 or is acquired and amplified by the imaging unit 10 to the wireless reception unit 40, as stated previously. To this end, the modulator 21 of the wireless communication unit 20 modulates the image signal so that the image signal may be wirelessly transmitted and received. The modulated signal is amplified through a separate amplifier and transmitted to a medium, for example, the air through the transmitter 22, which includes an antenna module, for example.

In the wireless reception unit 40, the transmitted signal is received through a receiver 41, which includes an antenna module, for example. A demodulator 42 demodulates the received signal to separate the image signal acquired by the imaging unit 10 from a carrier. The image processing unit 50 generates an image visually recognizable by the user based on the separated image signal and displays the generated image through a display unit 51 such as a monitor.

Alternatively, although not shown, the wireless communication unit 20 may include an analog/digital (ND) converter or a multiplexer. The A/D converter converts the image signal output from the electromagnetic wave receiver 12, amplifier 13 or image signal collector 14 into a digital signal when the image signal is an analog signal. The multiplexer multiplexes a plurality of image signals input over a plurality of channels so that the image signals may be modulated. In an embodiment, the wireless communication unit 20 may receive a plurality of image signals over a plurality of channels. For example, in the case where the imaging apparatus is a magnetic resonance imaging apparatus, the electromagnetic wave receiver 12 may include a plurality of reception or transmission/reception RF coils, each of which receives and outputs a magnetic resonance signal. As a result, the wireless communication unit 20 receives a plurality of magnetic resonance signals output over a plurality of channels, and the multiplexer multiplexes the received image signals so that the image signals may be transmitted over the wireless communication network. In this case, the magnetic resonance signal output from each RF coil may be amplified by the amplifier 13, for example, an RF preamplifier, and then transferred to the wireless communication unit 20, as stated previously. Provided that the wireless communication unit 20 includes the multiplexer, the wireless reception unit 40 will further include a demultiplexer to demultiplex a signal received through the wireless communication.

Figure 7:
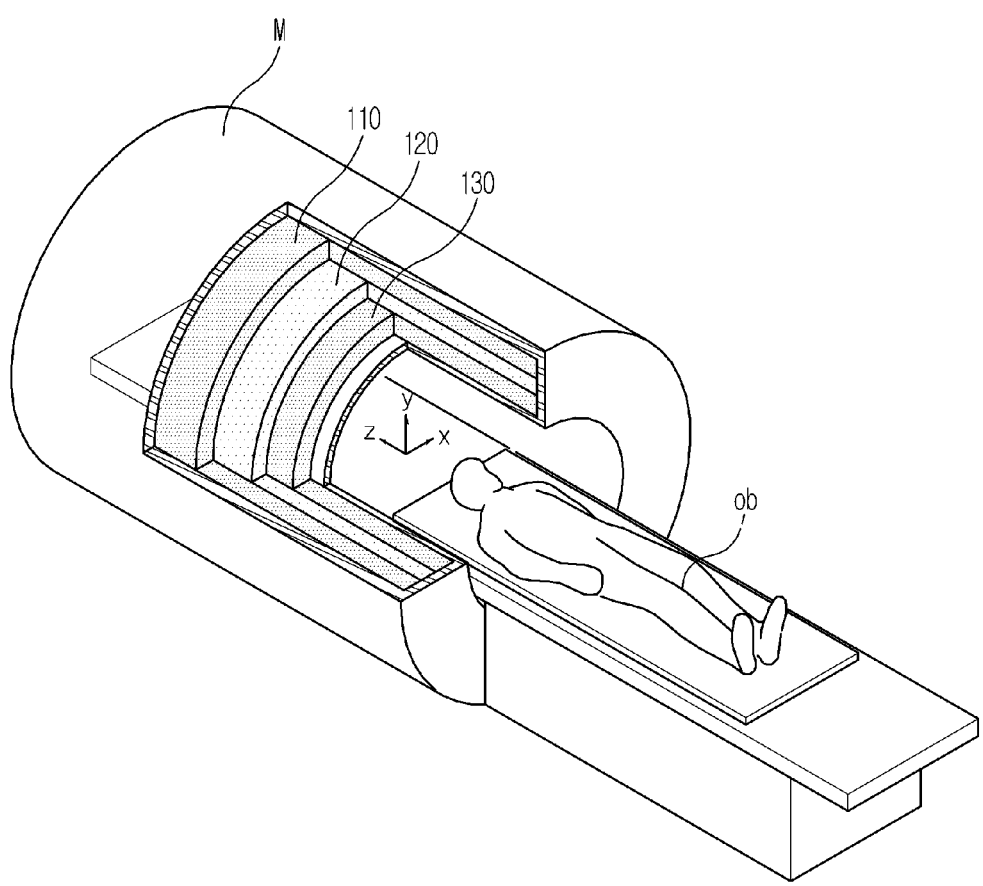
FIG. 7 is a perspective view illustrating an embodiment of a magnetic resonance imaging apparatus according to invention principles.
Figure 8:
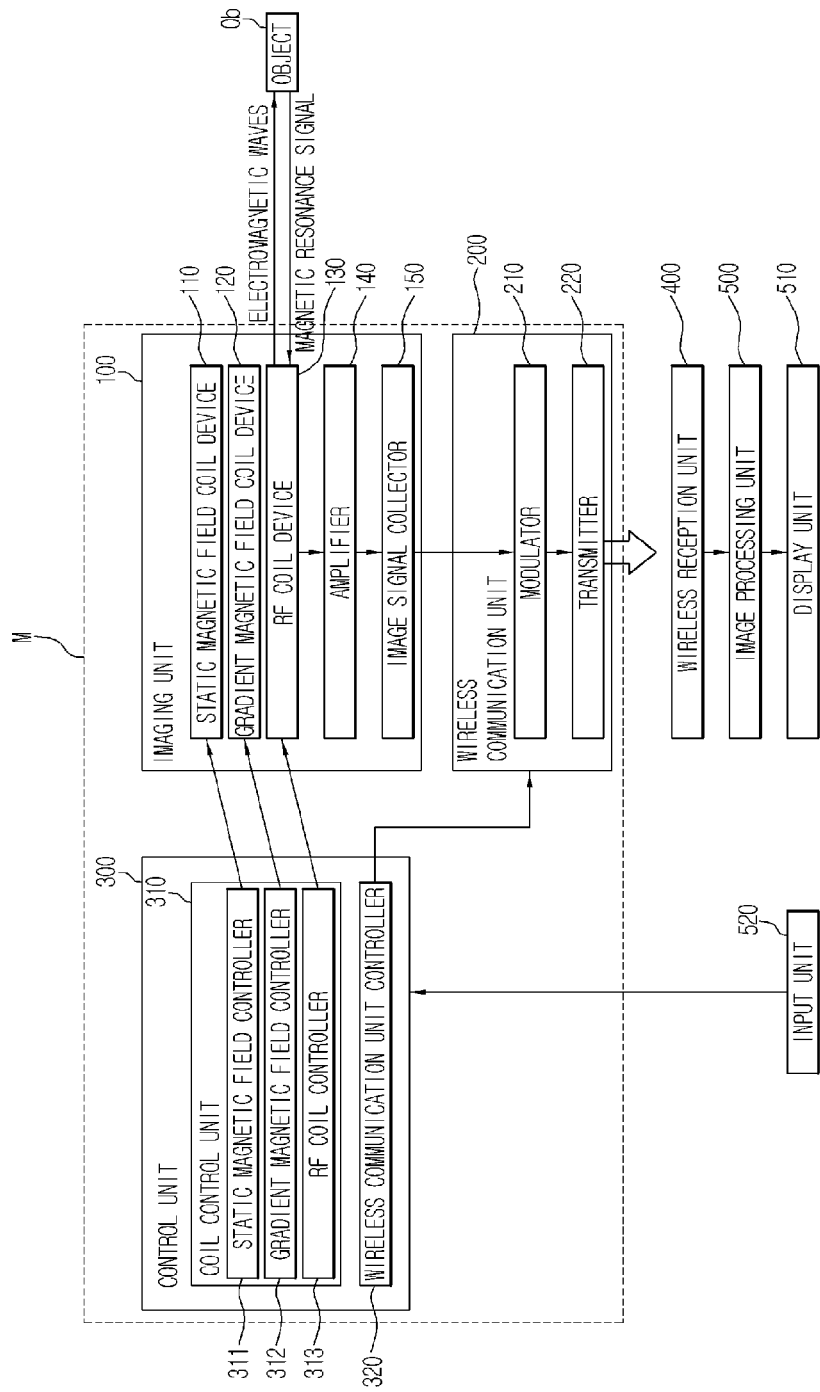
FIGS. 8, 9 and 10 are block diagrams illustrating various embodiments of the magnetic resonance imaging apparatus according to invention principles.

FIG. 7 is a perspective view illustrating an embodiment of a magnetic resonance imaging (MRI) apparatus, and FIG. 8 is a block diagram illustrating the embodiment of the MRI apparatus. In FIGS. 7 and 8, the MRI apparatus includes a body M and has an opening formed at one side thereof and a space into which an object ob, for example, the human body M is insertable through the opening, and a static magnetic field coil device 110, a gradient magnetic field coil device 120 and an RF coil device 130 formed around the space in the body M.

Hereinafter, the static magnetic field coil device 110, gradient magnetic field coil device 120 and RF coil device 130 around the body M, and parts for acquisition of a magnetic resonance image signal associated therewith are collectively referred to as imaging unit 100.

The static magnetic field coil device 110 of the imaging unit 100 generates a static magnetic field to magnetize the atomic nuclei of elements causing a magnetic resonance phenomenon, for example, hydrogen (H), phosphorus (P), sodium (Na), various carbon isotopes (C), for example. among elements distributed in the object ob, for example, a human body. Such an atomic nucleus has a spin. When the atomic nucleus is magnetized due to its exposure to the magnetic field, the spin thereof is aligned in the direction of the magnetic field. At this time, the atomic nucleus has a precession at a Larmor frequency at a certain angle to a central axis according to a torque resulting from the magnetic field. The static magnetic field coil device 110 generates the static magnetic field to the object ob, for example, a human body such that the atomic nuclei thereof process at the Larmor frequency. At this time, the Larmor frequency of the precession is proportional to the intensity of the static magnetic field. The static magnetic field generated by the static magnetic field coil device 110 is formed in a z-axis direction shown in FIG. 7. Provided that the object ob is a human body, the static magnetic field may be generated from head to foot. In the present embodiment, the static magnetic field coil device 110 may be made of a superconducting electromagnet or a permanent magnet.

The gradient magnetic field coil device 120 generates spatially linear gradient magnetic fields through a bore in the body M. The gradient magnetic field coil device 120 may employ three types of gradient coils to form gradient magnetic fields in x-axis, y-axis and z-axis directions for magnetic resonance imaging. When the magnetization vector of the atomic nucleus of hydrogen, phosphorus, sodium, or the like produced by the main magnetic field rotates on a transverse plane, the gradient coils spatially control the rotation frequency or phase of the magnetization vector so that a magnetic resonance image signal may be expressed in a spatial frequency domain, namely, a k-space.

The RF coil device 130 includes a plurality of RF coils. The RF coils may be transmission-only and reception-only RF coils or transmission/reception RF coils. The transmission-only or transmission/reception RF coils of the RF coil device 130 generate electromagnetic waves of the same or similar frequency as or to the Larmor frequency and apply the generated electromagnetic waves to the nucleus of an atom, for example, hydrogen, inside the object ob such that the magnetization vector produced by the static magnetic field rotates on the transverse plane horizontally to that plane. In response to receiving the electromagnetic waves, the atomic nucleus resonates to generate a magnetic resonance signal perpendicularly to the static magnetic field. A voltage signal, or free induction decay (FID) signal, is induced in a reception-only or transmission/reception RF coil adjacent to the atomic nucleus, so that the RF coil device 130 receives the magnetic resonance signal from the object. An amplifier 140 of the imaging unit 100 amplifies the magnetic resonance signal received by the RF coil device 130. An image signal collector 150 of the imaging unit 100 temporarily or non-temporarily stores the magnetic resonance signal received by the RF coil device 130 or amplified by the amplifier 140.

The magnetic resonance signal received by the RF coil device 130, amplified by the amplifier 140 or stored in the image signal collector 150 is transferred to a wireless communication unit 200, which transfers the magnetic resonance signal to an image signal processing unit 500 through a wireless reception unit 400.

The wireless communication unit 200 of the MRI apparatus transmits the magnetic resonance signal amplified by the amplifier 140 or stored in the image signal collector 150 to the wireless reception unit 400. The wireless communication unit 200 may include a modulator 210 and a transmitter 220. The modulator 210 and the transmitter 220 are the same as those stated previously with reference to FIG. 1B. In some embodiments, the wireless communication unit 200 may employ a synchronous system which also supports asynchronous transmission. In addition, when asynchronous wireless communication is performed, signal transmission may have a duration of at least 500 msec.

The wireless reception unit 400 receives the magnetic resonance signal transmitted from the wireless communication unit 200 and transfers the received signal to the image processing unit 500. The wireless reception unit 400 may be, for example, any one of a variety of wireless communication boards. In some embodiments, the wireless reception unit 400 may be installed in the scanner body M or a separate information processing device, for example, a workstation, isolated from the body M.

The image processing unit 500 generates a magnetic resonance image based on the transferred magnetic resonance signal and performs predetermined image processing for the generated magnetic resonance image to correct quality, for example, of the magnetic resonance image. Alternatively, the image processing unit 500 may generate a stereoscopic image based on a plurality of magnetic resonance images. The image processing unit 500 may be, for example, a microprocessor system installed in the scanner body M or a workstation isolated from the scanner body M.

The magnetic resonance image generated by the image processing unit 500 is displayed on a display unit 510. The display unit 510 may be one of various display devices coupled with the scanner body M. Alternatively, the display unit 510 may be a monitor which is connected to the workstation by wire or wirelessly. The MRI apparatus may include a control unit 300 to control the imaging unit 100 and wireless communication unit 200 of the body M. The control unit 300 may be installed in the scanner body M or in a workstation or the like outside the scanner body M. The control unit 300 includes a coil control unit 310 to control the static magnetic field coil device 110, gradient magnetic field coil device 120 and RF coil device 130 of the imaging unit 100, and a wireless communication unit controller 320 to control the wireless communication unit 200. The coil control unit 310 may include a static magnetic field controller 311, a gradient magnetic field controller 312, and an RF coil controller 313.

The static magnetic field controller 311 generates a control signal, for example, a driving command or driving stop command, conveyed to the static magnetic field coil device 110, which generates a static magnetic field in the MRI apparatus, and sends the generated control signal to the static magnetic field coil device 110. Although not shown, the static magnetic field controller 311 may initiate or interrupt application of power to the static magnetic field coil device 110 to control the static magnetic field coil device 110.

The gradient magnetic field controller 312 generates a control command conveyed to the gradient magnetic field coil device 120, which generates gradient magnetic fields, to control the generation of the gradient magnetic fields by the gradient magnetic field coil device 120. The gradient magnetic field controller 312 may control application of power to the gradient magnetic field coil device 120 to control the gradient magnetic field coil device 120.

The RF coil controller 313 generates a control command conveyed to the RF coil device 130, which generates electromagnetic waves and applies the generated electromagnetic waves to the object. The RF coil controller 313 may control the RF coil device 130 in such a manner as to apply or interrupt power to the RF coil device 130. As a result, a determination as to whether to generate electromagnetic waves in the MRI apparatus may be made under the control of the RF coil controller 313.

The wireless communication unit controller 320 generates a control signal to control the wireless communication unit 200 such that the wireless communication unit 200 is driven or is not driven, and sends the generated control signal to the wireless communication unit 200. While electromagnetic waves are generated by the imaging unit 100, for example, the RF coil device 130, the wireless communication unit controller 320 controls the wireless communication unit 200 such that the wireless communication unit 200 does not generate radio waves and wireless communication is inhibited. Conversely, when electromagnetic waves are not generated by the imaging unit 100, in an idle period, the wireless communication unit controller 320 controls the wireless communication unit 200 such that the wireless communication unit 200 generates radio waves to perform wireless communication.

In this case, the wireless communication unit controller 320 generates a control signal opposite to a control signal generated by the coil control unit 310, for example, the RF coil controller 313 based on the control signal generated by the coil control unit 310 such that the wireless communication unit 200 operates in an opposite manner to the RF coil device 130 of imaging unit 100, for example. RF coil controller 313 applies a control signal to the RF coil device 130 and, concurrently, conveys the control signal or a signal corresponding thereto, to the wireless communication unit controller 320 such that the wireless communication unit controller 320 generates a control signal to control the operation of the wireless communication unit 200 based on the operation of the RF coil device 130.

As needed, the control unit 300 may receive a certain instruction or command input from the user through an input unit 520 and generates a control signal conveyed to the imaging unit 100 or wireless communication unit 200 in response to the received instruction or command.

Figure 9:
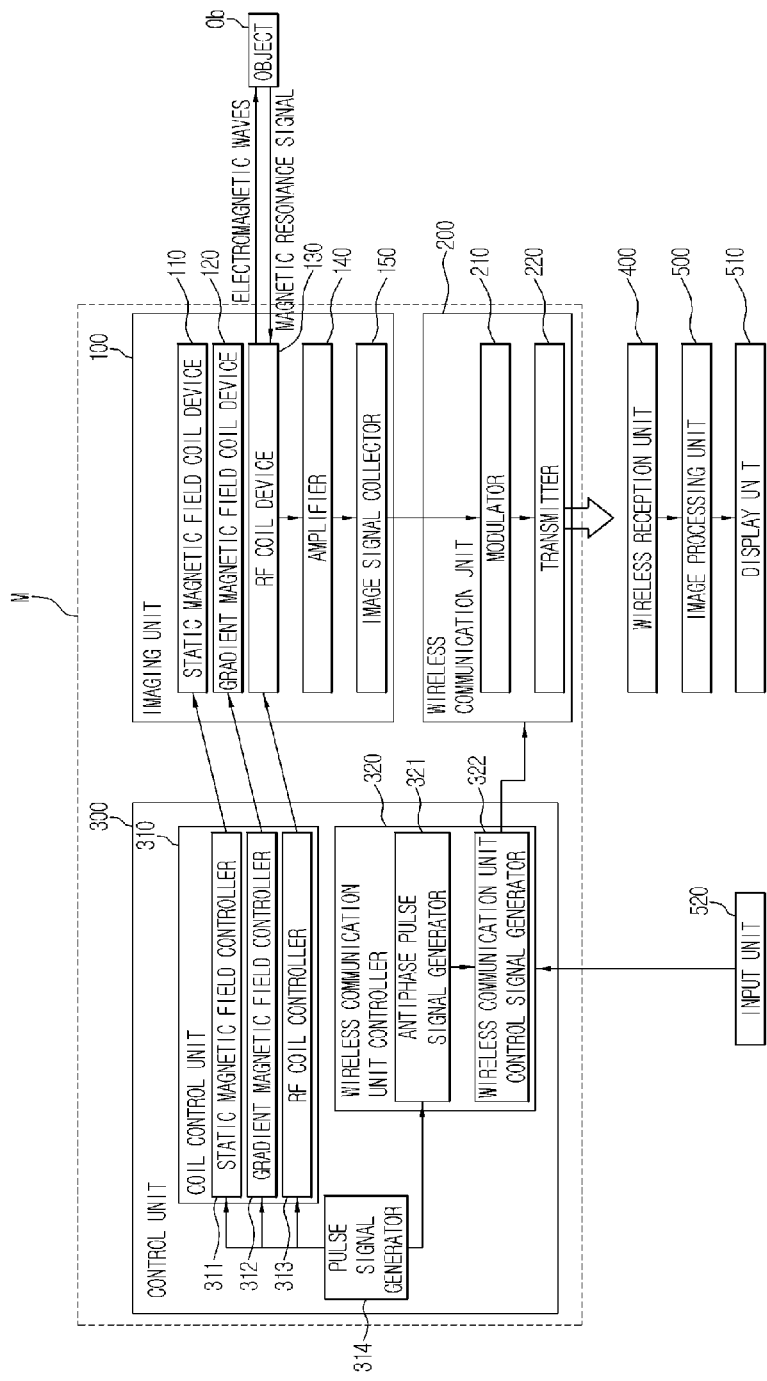

FIG. 9 is a block diagram illustrating another embodiment of the MRI apparatus where the control unit 300 of the MRI apparatus further includes a pulse signal generator 314, and the wireless communication unit controller 320 may include an antiphase pulse signal generator 321 and a wireless communication unit control signal generator 322. The pulse signal generator 314 generates a pulse signal having a certain pulse sequence, for example, any one of the pulse sequences as shown in FIGS. 4A to 4C, and applies the generated pulse signal to the coil control unit 310. The coil control unit 310 generates a control signal based on the applied pulse signal such that a coil device of the imaging unit 100, for example, the static magnetic field coil device 110 or RF coil device 130 is driven or is not driven, and sends the generated control signal to the imaging unit 100.

For example, the pulse signal generator 314 inputs a pulse signal having a certain pulse sequence to the RF coil controller 313 of the coil control unit 310, which then generates a control signal to the RF coil device 130 based on the pulse sequence of the input pulse signal. The control signal generated by the RF coil controller 313 has a pulse sequence corresponding to the pulse sequence of the pulse signal generated by the pulse signal generator 314. That is, as an example, when the pulse signal input from the pulse signal generator 314 is not 0 as shown in FIG. 4A (d1, d3 or d5), the RF coil controller 313 generates a control signal, namely, an operation command signal to the RF coil device 130. However, when the input pulse signal is 0 (d2, d4 or d6), the RF coil controller 313 generates no control signal to the RF coil device 130 or another control signal comprising an operation stop signal to the RF coil device 130.

Alternatively, in an opposite manner to the above, the RF coil controller 313 may generate no control signal when the pulse signal input from the pulse signal generator 314 is not 0 (d1, d3 or d5), and a control signal, namely, an operation command signal to the RF coil device 130 when the input pulse signal is 0 (d2, d4 or d6). The RF coil device 130 generates or does not generate electromagnetic waves in response to a pulse sequence of a control signal sent thereto. The pulse signal from the pulse signal generator 314 is also transferred to the antiphase pulse signal generator 321 of the wireless communication unit controller 320.

The antiphase pulse signal generator 321 generates a pulse signal of an opposite phase to that of the input pulse signal, an antiphase pulse signal. For example, as stated previously with reference to FIGS. 4A to 4C, the antiphase pulse signal generator 321 may conversely output a pulse signal which is not 0, when the input pulse signal is 0 (d2, d4 or d6), and a pulse signal which is 0, when the input pulse signal is not 0 (d1, d3 or d5). In another embodiment, when the input pulse signal has a certain value which is not 0, the antiphase pulse signal generator 321 may output a pulse signal having a value different from that of the input pulse signal, for example, a pulse signal having the same absolute value as that of the input pulse signal, but a negative sign.

In an embodiment, when a pulse signal is input for generation of an antiphase pulse signal, the antiphase pulse signal generator 321 generates the antiphase pulse signal in real time based on the input pulse signal. In the another embodiment, the antiphase pulse signal generator 321 may receive information about a pulse sequence from the pulse signal generator 314 in advance, calculate an antiphase pulse sequence based on the received pulse sequence information, and generate an antiphase pulse signal having the calculated antiphase pulse sequence. The wireless communication unit control signal generator 322 generates a control signal to the wireless communication unit 200 based on an antiphase pulse signal generated and output by the antiphase pulse signal generator 321. In this case, the wireless communication unit 200 operates or does not operate in response to the control signal generated by the wireless communication unit control signal generator 322.

Because the control signal to the wireless communication unit 200 generated by the wireless communication unit control signal generator 322 has an opposite phase to that of the control signal to the imaging unit 100, the wireless communication unit 200 operates in an opposite manner to the imaging unit 100, more particularly the RF coil device 130.

Therefore, when the RF coil device 130 of the imaging unit 100 generates electromagnetic waves, the wireless communication unit 200 does not operate, so that there is no interference from radio waves from the wireless communication unit 200. As a result, a magnetic resonance image signal is received free of noise resulting from interference from unit 200 radio waves. Conversely, when the wireless communication unit 200 generates radio waves, the RF coil device 130 of the imaging unit 100 does not operate, so that the radio waves from the wireless communication unit 200 are not subject to interference from electromagnetic waves from the RF coil device 130. As a result, a magnetic resonance image signal is received from unit 200 free of noise resulting from interference from RF coil electromagnetic waves, for example.

Figure 10:
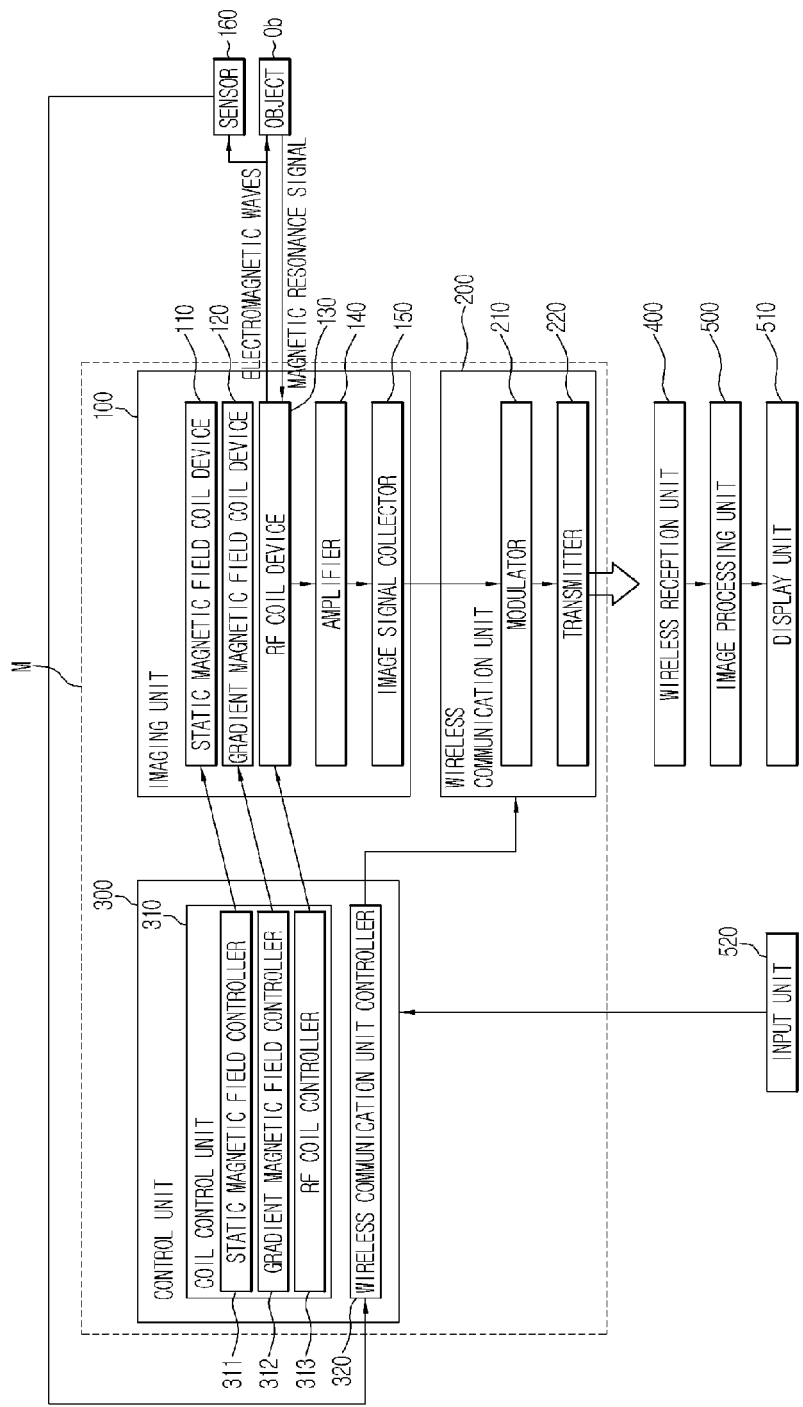

FIG. 10 is a block diagram illustrating a further embodiment of the MRI apparatus where the MRI apparatus further includes a sensor 160 to sense electromagnetic waves generated by the RF coil device 130 and send a result of the sensing to the control unit 300. The control unit 300, more particularly the wireless communication unit controller 320, receives an electromagnetic wave sense signal sent from the sensor 160 and generates a control signal for control of the wireless communication unit 200 based on the received signal. In the case of receiving the electromagnetic wave sense signal from the sensor 160, the wireless communication unit controller 320 generates an operation stop command to the wireless communication unit 200. The wireless communication unit 200 receives the operation stop command from the wireless communication unit controller 320 and inhibits wireless communication by unit 200, in response to the received operation stop command.

Conversely, in the case of receiving no electromagnetic wave sense signal or an electromagnetic wave non-detect sense signal from the sensor 160, the wireless communication unit controller 320 generates an operation command to the wireless communication unit 200. The wireless communication unit 200 receives the operation command from the wireless communication unit controller 320 and operates in response to the received operation command. As a result, the wireless communication unit 200 transmits the transferred magnetic resonance signal to the wireless reception unit 400, which is installed in the scanner body M or in a separate device outside the body M.

Figure 11:
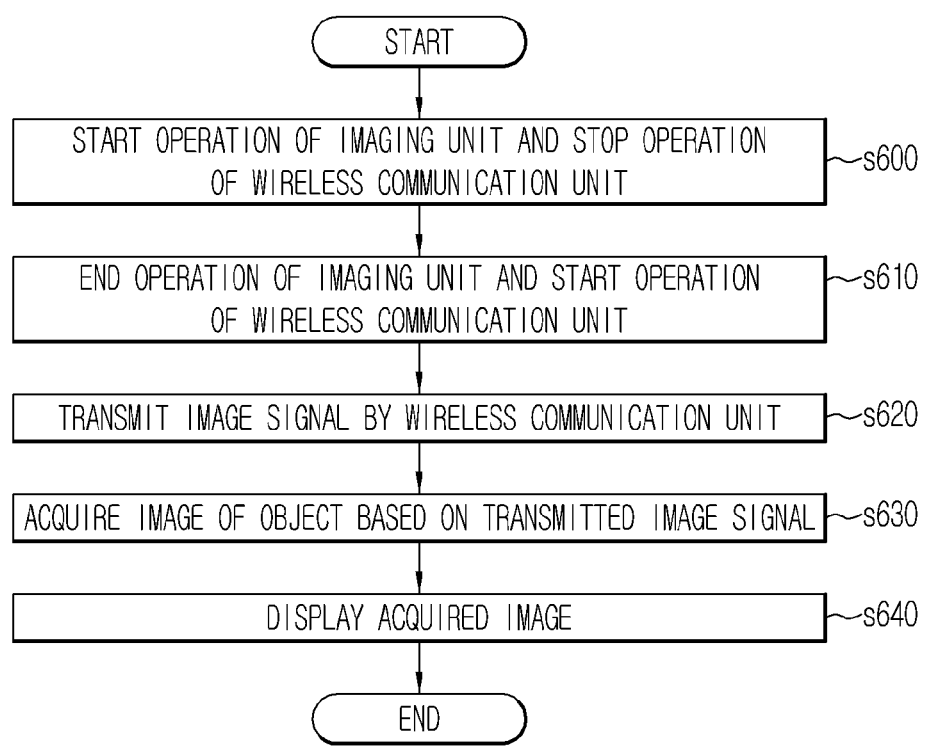

FIG. 11 is a flowchart illustrating an embodiment of a method of controlling the imaging apparatus of FIG. 1 where the imaging unit 10 of the MRI apparatus starts to operate (s600) and power is applied to the imaging unit 10 such that the imaging unit 10 operates. Once the imaging unit 10 operates, it applies electromagnetic waves to the object ob, exposed to a magnetic field, and receives an image signal generated by the applied electromagnetic waves, for example, a magnetic resonance signal. The received magnetic resonance signal is amplified by the amplifier 13 and then stored in the image signal collector 14, such as a memory.

During operation of imaging unit 10 the wireless communication unit 20 does not operate and operation of the wireless communication unit is inhibited, and remains inhibited if it is already not in operation. In this case, power to the wireless communication unit 20 may be interrupted such that the wireless communication unit 20 does not operate. In response to the imaging unit 10 stopping the electromagnetic wave application to the object ob to end the imaging, the wireless communication unit 20 starts to operate (s610) and power is applied to the wireless communication unit 20 such that the wireless communication unit 20 operates. The wireless communication unit 20 transmits an image signal, for example, a magnetic resonance signal transferred from the imaging unit 10 to the wireless reception unit 40 (s620 while imaging unit 10 does not operate in response to power to the imaging unit 10 being interrupted, for example.

The image signal received by the wireless reception unit 40 is transferred to the image processing unit 50, which derives an image in response to the received signal, for example, a magnetic resonance image of the object ob based on the image signal (s630). The acquired image, such as a magnetic resonance image is displayed on a display unit, for example, a monitor of a workstation (s640).

Figure 12:
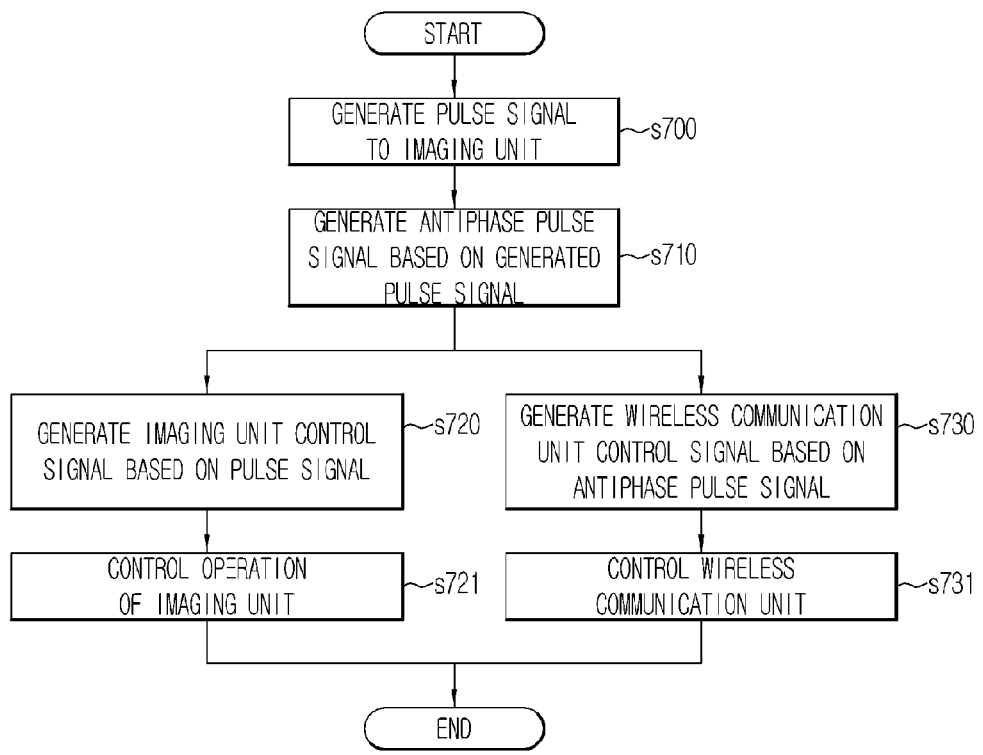

FIG. 12 is a flowchart illustrating another embodiment of the method of controlling the imaging apparatus using a pulse signal for control the imaging unit 10 is generated (s700). A pulse signal of an opposite phase to that of the generated pulse signal, an antiphase pulse signal, is generated based on the generated pulse signal (s710). An imaging unit control signal for control of the imaging unit 10 is generated based on the generated pulse signal (s720). The imaging unit control signal has a pulse sequence corresponding to a pulse sequence of the generated pulse signal. The imaging unit 10 operates or does not operate in response to the imaging unit control signal (s721). In this case, the imaging unit 10 operates based on the pulse sequence of the imaging unit control signal.

A wireless communication unit control signal conveyed to the wireless communication unit 20 is generated based on the generated antiphase pulse signal (s730). The wireless communication unit control signal has a pulse sequence corresponding to a pulse sequence of the antiphase pulse signal. The wireless communication unit 20 is controlled according to the wireless communication unit control signal (s731). In this case, because the pulse sequence of the wireless communication unit control signal has an opposite phase to that of the pulse sequence of the pulse signal applied to the imaging unit 10, the wireless communication unit 20 operates in an opposite manner to the imaging unit 10. Therefore, the imaging unit 10 and the wireless communication unit 20 are controlled such that they operate in a mutually exclusive and opposite manner to each other, such that the wireless communication unit 20 stops operation when the imaging unit 10 operates, and the imaging unit 10 stops the operation thereof when the wireless communication unit 20 operates.

This imaging apparatus control method will hereinafter be described in more detail with reference to FIG. 13, which is a flowchart illustrating another embodiment of the imaging apparatus control method. If a user inputs an imaging command to the imaging apparatus, for example, the MRI apparatus through the input unit 520, provided in a workstation or the like (s800), the control unit 30, as an example, generates a pulse signal for control of the imaging unit 10 in response to the input imaging command (s810). In this case, the pulse signal may be generated, for example, as shown in the upper graphs of FIGS. 4A to 4C or generated in more various patterns as well as those shown in those drawings.

When the pulse signal generated by the control unit 30 is not 0, for example, when it corresponds to the duration d1 shown in FIG. 4A, the imaging unit 10 starts to operate in response to the pulse signal which is not 0 (s820). Alternatively, the imaging unit 10 may be set to operate when the pulse signal is 0 or when the pulse signal has a specific value.

On the other hand, the control unit 30 generates an antiphase pulse signal of an opposite phase to that of the generated pulse signal based on the generated pulse signal (s830). For example, the antiphase pulse signal is generated as shown in the lower graphs of FIGS. 4A to 4C when the pulse signal is generated as shown in the upper graphs of FIGS. 4A to 4C. The antiphase pulse signal is generated in real time or based on an antiphase pulse sequence pre-calculated based on a pulse sequence of the pulse signal. When the imaging unit 10 starts to operate, the wireless communication unit 20 stops the operation thereof or remains not operating, in response to the antiphase pulse signal (s831). With the lapse of time, the pulse signal and the antiphase pulse signal may be changed in phase (s840). For example, as in the duration d2 shown in FIG. 4A, the pulse signal may be changed to 0 and the antiphase pulse signal may be changed to a value which is not 0.

As a result, operation of the imaging unit 10 ends imaging according to the phase change of the pulse signal (s850). Conversely, the wireless communication unit 20 starts the operation thereof, namely, the wireless communication according to the phase change of the antiphase pulse signal (s860). Alternatively, the wireless communication unit 20 may be set to operate when the antiphase pulse signal is 0 or when the antiphase pulse signal has a specific value. The wireless communication unit 20 transmits an image signal, for example, a magnetic resonance signal acquired by the imaging unit 10 to the wireless reception unit 40 (s870). The image processing unit 50 generates an image, for example, a magnetic resonance image of the object ob based on the image signal received by the wireless reception unit 40 (s880). The generated image, for example, magnetic resonance image is displayed to the user through a workstation or the like (s890). Therefore, the imaging unit 10 and the wireless communication unit 20 operate alternately, preventing generation of noise resulting from interference between the electromagnetic waves from the imaging unit 10 and the radio waves from the wireless communication unit 20.

FIG. 14 is a flowchart illustrating a further embodiment of the imaging apparatus control method where the imaging unit 10 operates to apply electromagnetic waves to the object ob and acquires an image signal from the object ob (s900). For example, the imaging unit 10 applies electromagnetic waves to the object ob through a transmission or transmission/reception RF coil of the RF coil device 130 and acquires a magnetic resonance signal based on magnetic resonance of an atomic nucleus in the object ob through a reception or transmission/reception RF coil of the RF coil device 130. In this case, the magnetic resonance signal may be amplified through the amplifier 140.

The imaging unit 10 applies electromagnetic waves to the object ob, the sensor 15 senses the applied electromagnetic waves (s901) and sensor 15 converts a result of the sensing into an electrical signal, comprising an electromagnetic wave sense signal and sends the sense signal to the control unit 30. Upon receiving the electromagnetic wave sense signal, the control unit 30 generates a wireless communication unit operation stop signal and sends the generated signal to the wireless communication unit 20 (s902). Alternatively, the sensor 15 may directly send the electromagnetic wave sense signal to the wireless communication unit 20. The wireless communication unit 20 stops operation or remains not operating, in response to the wireless communication unit operation stop signal or the signal sent directly from the sensor 15 (s903). Imaging unit 10 stops operation due to the end of the imaging or the like (s910) and the sensor 15 senses no electromagnetic waves applied (s911). When electromagnetic waves are not sensed, the sensor 15 generates a certain electrical signal, comprising an electromagnetic wave non-detect sense signal and sends the generated signal to the control unit 30, or may not generate an electrical signal. Alternatively, the sensor 15 may directly send the electromagnetic wave non-detect sense signal to the wireless communication unit 20. In response to receiving the electromagnetic wave non-detect sense signal or no electrical signal, the control unit 30 generates a wireless communication unit operation start signal and sends the generated signal to the wireless communication unit 20 (s912).

The wireless communication unit 20 starts operation in response to a wireless communication unit operation start signal or the signal sent directly from the sensor 15 (s913). As the wireless communication unit 20 starts to operate, it transmits an image signal, for example, a magnetic resonance signal to the wireless reception unit 40 (s920). The image processing unit 50, connected with the wireless reception unit 40, generates an image, for example, a magnetic resonance image of the object ob in response to the transmitted image signal, for example, magnetic resonance signal (s930). As needed, the image processing unit 50 may further perform certain image processing for the magnetic resonance image to adjust contrast or brightness of the magnetic resonance image or generate a stereoscopic image based on the magnetic resonance image.

A magnetic resonance image, for example, generated by the image processing unit 50 is displayed to the user through a monitor or the like (s940). The wireless communication unit 20 does not operate when the imaging unit 10 operates, and, conversely, the imaging unit 10 does not operate when the wireless communication unit 20 operates, thereby preventing generation of noise in an image resulting from interference between the electromagnetic waves from the imaging unit 10 and the radio waves from the wireless communication unit 20.

The above-described imaging apparatus control method may be similarly applied to the MRI apparatus shown in FIGS. 7 to 10. As is apparent from the above description, in an imaging apparatus and a method of controlling the same, an imaging unit and a wireless communication unit may be controlled in a proper manner. Further, in a magnetic resonance imaging apparatus which images an object using a magnetic field and electromagnetic waves, an imaging unit and a wireless communication unit may be controlled appropriately, thereby preventing generation of noise resulting from interference between radio waves and the electromagnetic waves, such as induction of a magnetic resonance image signal in a radio wave signal. Moreover, when an object is imaged using electromagnetic waves, the system prevents generation of noise in an acquired image resulting from interference between the electromagnetic waves and radio waves. Therefore, an accurate image signal is transmitted and acquired without using an additional separate noise removal system. Further, an image signal without the interference noise is transmitted and received through wireless communication, resulting in reduction in use of a wired cable in an imaging apparatus advantageously overcoming spatial restrictions in imaging apparatus installation.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for".

Although different embodiments of the present invention are shown and described, it would be appreciated by those skilled in the art that changes may be made in these embodiments without departing from the principles and spirit of the invention, the scope of which is defined in the claims and their equivalents.

What is claimed is:

1. An imaging apparatus comprising:
an imaging unit to acquire an image signal of an object using electromagnetic waves;
a wireless communication unit to transmit the acquired image signal using a wireless communication network; and
a control unit to inhibit operation of wireless communication in transmitting the acquired image signal while the imaging unit operates in acquiring an image signal of an object using electromagnetic waves.

2. The imaging apparatus according to claim 1, wherein the control unit operates the wireless communication unit when the imaging unit operation in acquiring the image signal is inhibited.

3. The imaging apparatus according to claim 2, wherein the imaging unit generates the electromagnetic waves or stops the generation of the electromagnetic waves in response to a pulse signal provided to the imaging unit.

4. The imaging apparatus according to claim 3, wherein the control unit generates an antiphase pulse signal having an opposite phase to that of the pulse signal applied to the imaging unit, and controls the wireless communication unit in response to the antiphase pulse signal.

5. The imaging apparatus according to claim 4, wherein the control unit at least one of, (a) applies and (b) interrupts, power to the wireless communication unit in response to the antiphase pulse signal to control the operation of the wireless communication unit.

6. The imaging apparatus according to claim 1, wherein the wireless communication unit transmits the acquired image signal to an external wireless reception unit using an asynchronous wireless communication system.

7. The imaging apparatus according to claim 6, wherein the asynchronous wireless communication system has signal communication time duration of at least 500 msec.

8. An imaging apparatus comprising:
an imaging unit to acquire an image signal of an object using electromagnetic waves; and
a wireless communication unit to transmit the acquired image signal to an external wireless reception unit,
wherein the wireless communication unit inhibits wireless communication operation when the imaging unit operates in acquiring an image signal of an object using electromagnetic waves and initiates wireless communication operation when the imaging unit does not operate in acquiring an image signal of an object using electromagnetic waves.

9. A method of controlling an imaging apparatus, the method comprising:
generating a pulse signal;
conveying the pulse signal to an imaging unit, said imaging unit imaging an object to acquire an image signal of the object;
generating an antiphase pulse signal in response to the generated pulse signal, said antiphase pulse signal having an opposite phase to that of the pulse signal; and
controlling a wireless communication unit based on the antiphase pulse signal, the wireless communication unit transmitting the image signal using a wireless communication network.

10. The method according to claim 9, wherein the controlling comprises stopping operation of the wireless communication unit when the imaging unit generates electromagnetic waves, and operating the wireless communication unit to transmit the image signal using a wireless communication network when the imaging unit stops the generation of the electromagnetic waves.

11. The method according to claim 10, further comprising the imaging the object using the imaging unit, in response to the pulse signal to acquire the image signal of the object.

12. The method according to claim 11, further comprising the wireless communication unit for transmitting the acquired image signal to an external wireless reception unit when operating.

13. The method according to claim 9, wherein the controlling comprises applying or interrupting power to the wireless communication unit based on the antiphase pulse signal to control operation of the wireless communication unit.

14. The method according to claim 9, wherein the wireless communication unit transmits the image signal using an asynchronous wireless communication system.

15. A magnetic resonance imaging apparatus comprising:
an imaging unit to generate electromagnetic waves, apply the generated electromagnetic waves to an object exposed to a magnetic field, and receive a magnetic resonance signal generated in the object in response to the applied electromagnetic waves;
a wireless communication unit to transmit the received magnetic resonance signal;
a control unit to inhibit wireless communication of the received magnetic resonance signal while the imaging unit generates the electromagnetic waves and applies the generated electromagnetic waves to the object;
a wireless reception unit to receive the magnetic resonance signal from the wireless communication unit; and
an image processing unit to generate a magnetic resonance image in response to the magnetic resonance signal received by the wireless reception unit.

16. The magnetic resonance imaging apparatus according to claim 15, wherein the control unit operates the wireless communication unit when the imaging unit stops the generation of the electromagnetic waves and the application of the electromagnetic waves to the object.

17. The magnetic resonance imaging apparatus according to claim 16, wherein the control unit comprises a pulse signal generator to generate a pulse signal for control of operation of the imaging unit and to convey the generated pulse signal to the imaging unit.

18. The magnetic resonance imaging apparatus according to claim 17, wherein the imaging unit generates the electromagnetic waves or stops the generation of the electromagnetic waves in response to the pulse signal.

19. The magnetic resonance imaging apparatus according to claim 17, wherein the control unit further comprises an antiphase pulse signal generator to generate an antiphase pulse signal based on the pulse signal generated by the pulse signal generator, the antiphase pulse signal having an opposite phase to that of the pulse signal generated by the pulse signal generator,
wherein the control unit controls the operation of the wireless communication unit in response to the antiphase pulse signal.

20. The magnetic resonance imaging apparatus according to claim 19, wherein the control unit applies or interrupts power to the wireless communication unit in response to the antiphase pulse signal to control the operation of the wireless communication unit.

21. The magnetic resonance imaging apparatus according to claim 15, wherein the wireless communication unit transmits the magnetic resonance signal to the wireless reception unit using an asynchronous wireless communication system.

22. The magnetic resonance imaging apparatus according to claim 21, wherein the asynchronous wireless communication system has signal communication time duration of at least 500 msec.

* * * * *